United States Patent
Kwon et al.

(10) Patent No.: US 11,882,744 B2
(45) Date of Patent: Jan. 23, 2024

(54) DISPLAY DEVICE INCLUDING DISPLAY DEVICES CONNECTED TOGETHER VIA PROTRUSIONS AND GROOVES

(71) Applicant: Samsung Display Co., LTD., Yongin-si (KR)

(72) Inventors: Seung Wook Kwon, Hwaseong-si (KR); Jeong Seok Lee, Yongin-si (KR); Se Hoon Jeong, Suwon-si (KR); Woo Yong Sung, Seoul (KR); Seung Gun Chae, Hwaseong-si (KR); Seung Yeon Chae, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/232,876

(22) Filed: Apr. 16, 2021

(65) Prior Publication Data
US 2022/0069062 A1 Mar. 3, 2022

(30) Foreign Application Priority Data
Sep. 2, 2020 (KR) .......................... 10-2020-0111371

(51) Int. Cl.
| | |
|---|---|
| H01L 27/32 | (2006.01) |
| G09F 9/302 | (2006.01) |
| H10K 59/18 | (2023.01) |
| H10K 59/131 | (2023.01) |

(52) U.S. Cl.
CPC .......... *H10K 59/18* (2023.02); *G09F 9/3026* (2013.01); *H10K 59/131* (2023.02)

(58) Field of Classification Search
None
See application file for complete search history.

(56) References Cited

U.S. PATENT DOCUMENTS

| | | | | |
|---|---|---|---|---|
| 5,118,370 | A | * | 6/1992 | Ozawa .................... B23K 20/10 228/1.1 |
| 5,164,853 | A | * | 11/1992 | Shimazaki .......... G02F 1/13336 349/149 |
| 5,600,910 | A | * | 2/1997 | Blackburn ............... F21S 2/005 40/605 |
| 2005/0093768 | A1 | * | 5/2005 | Devos .................... G06F 3/1446 345/1.3 |
| 2005/0178034 | A1 | * | 8/2005 | Schubert .................... G09F 9/33 40/605 |
| 2008/0037284 | A1 | * | 2/2008 | Rudisill .................. F21V 23/06 362/629 |
| 2008/0141572 | A1 | * | 6/2008 | Tomich ..................... G09F 9/30 40/605 |

(Continued)

FOREIGN PATENT DOCUMENTS

| | | |
|---|---|---|
| KR | 10-2067090 | 1/2020 |
| KR | 10-2020-0083713 | 7/2020 |

*Primary Examiner* — Kirk W Hermann
(74) *Attorney, Agent, or Firm* — KILE PARK REED & HOUTTEMAN PLLC

(57) ABSTRACT

A tiled display includes a first display device comprising a first display area and a first pad area having grooves, and a second display device comprising a second display area and a second pad area overlapping the second display area, the second pad area having protrusions, wherein the protrusions are inserted into the grooves to connect the first pad area with the second pad area.

17 Claims, 22 Drawing Sheets

(56) References Cited

U.S. PATENT DOCUMENTS

| | | | |
|---|---|---|---|
| 2008/0231776 A1* | 9/2008 | Shin | G02F 1/133603 349/61 |
| 2010/0046210 A1* | 2/2010 | Mathai | F21K 9/232 362/147 |
| 2010/0302284 A1* | 12/2010 | Karaki | G09G 5/006 345/1.3 |
| 2012/0062152 A1* | 3/2012 | Sanfilippo | F21V 21/005 362/244 |
| 2014/0097636 A1* | 4/2014 | Snider | B60J 7/0015 296/97.8 |
| 2014/0347766 A1* | 11/2014 | Biskeborn | G11B 5/40 360/323 |
| 2015/0055343 A1* | 2/2015 | Liao | F21V 23/06 362/249.03 |
| 2015/0301781 A1* | 10/2015 | Ekkaia | F21S 8/03 362/237 |
| 2016/0149318 A1* | 5/2016 | Lee | H01R 9/2458 361/783 |
| 2017/0220310 A1* | 8/2017 | Hochman | H01R 13/6205 |
| 2019/0018277 A1* | 1/2019 | Berner | G02F 1/1343 |
| 2019/0357340 A1* | 11/2019 | Siu | H05F 3/04 |
| 2020/0090560 A1* | 3/2020 | Dewaele | G06F 3/1446 |
| 2020/0121944 A1* | 4/2020 | Strahan | A61N 5/0616 |
| 2022/0001746 A1* | 1/2022 | Takamatsu | B60K 35/00 |

* cited by examiner

DISPLAY DEVICE INCLUDING DISPLAY DEVICES CONNECTED TOGETHER VIA PROTRUSIONS AND GROOVES

CROSS-REFERENCE TO RELATED APPLICATION(S)

This application claims priority to and benefits of Korean Patent Application No. 10-2020-0111371 under 35 U.S.C. § 119, filed on Sep. 2, 2020 in the Korean Intellectual Property Office, the entire contents of which are incorporated herein by reference.

BACKGROUND

1. Technical Field

The disclosure relates to a tiled display.

2. Description of the Related Art

As information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device may include a light-emitting element that can emit light on its own, so that each of the pixels of the display panel can emit light by themselves. Accordingly, a light-emitting display device can display images without a backlight part that supplies light to the display panel.

For a display device having a large screen, a great number of pixels may be disposed, and thus the defect rate of light-emitting elements may increase while productivity or reliability may decrease. To overcome such issues, a tiled display can provide a large screen by connecting a plurality of display devices having a relatively small size. However, such a tiled display may include boundaries between the plurality of display devices because there may be non-display areas or bezels between the plurality of display devices adjacent to each other. Such boundaries between the display devices may result in visible seams, hindering a viewer from getting immersed into the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a tiled display that may eliminate visible seams between a plurality of display devices by way of preventing the boundaries between the display devices from being recognized so that a viewer can be immersed into displayed images.

It should be noted that aspects of the disclosure are not limited to the above. Other aspects of the disclosure will be apparent to those skilled in the art from the following descriptions.

According to embodiments of the disclosure, a tiled display can be formed by connecting first display devices having grooves with second display devices having protrusions. Accordingly, the tiled display can allow a viewer to get immersed into the images by suppressing the boundary between the display areas of the display devices from being perceived by the viewer.

It should be noted that effects of the disclosure are not limited to those described above and other effects of the disclosure will be apparent to those skilled in the art from the following descriptions.

According to an embodiment of the disclosure, the tiled display may comprise a first display device comprising a first display area and a first pad area having grooves, and a second display device comprising a second display area and a second pad area overlapping the second display area, the second pad area having protrusions, wherein the protrusions may be inserted into the grooves to connect the first pad area with the second pad area.

In an embodiment, the first pad area may comprise first connection patterns filling the grooves. The protrusions of the second pad area may comprise second connection patterns.

In an embodiment, the first pad area may comprise a first signal line extended from the first display area. The grooves may expose the first signal line.

In an embodiment, the first connection patterns may contact the first signal line through the grooves.

In an embodiment, the second pad area may comprise a second signal line extended from the second display area, and holes exposing the second signal line.

In an embodiment, the second connection patterns may contact the second signal line through the holes.

In an embodiment, a diameter of the second connection patterns may be equal to a diameter of the holes, and the diameter of the second connection patterns is smaller than a diameter of the grooves.

In an embodiment, the second display device may comprise a substrate, and the second connection patterns may protrude to outside of the substrate.

In an embodiment, a height of the second connection patterns protruding from the substrate may be greater than a depth of the grooves of the first pad area.

In an embodiment, the tiled display may further comprise anisotropic conductive films disposed between the second connection patterns and the first connection patterns.

In an embodiment, each of the first connection patterns may at least one of ITO, IZO, and ITZO.

In an embodiment, the second connection patterns may include at least one of a metal layer, a metal pin, and a silver (Ag) dot.

In an embodiment, the first pad area may not overlap the first display area and may overlap the second pad area.

According to an embodiment of the disclosure, the tiled display may comprise a first display device comprising a first display area and a first pad area having grooves, and a second display device comprising a second display area and a second pad area overlapping the second display area, the second pad area having protrusions. The second display device may comprise a substrate, and a step in the second pad area that may include a thinner portion of the substrate, and the protrusions may be inserted into the grooves to connect the first pad area with the second pad area.

In an embodiment, the substrate may comprise a first base substrate, a barrier layer disposed on the first base substrate, and a second base substrate disposed on the barrier layer.

In an embodiment, the step may be formed by removing at least one of the first base substrate, the barrier layer, and the second base substrate in the second pad portion.

In an embodiment, the first pad area may comprise first connection patterns filling the grooves. The protrusions of the second pad area may comprise second connection patterns.

In an embodiment, the first pad area may comprise a first signal line extended from the first display area, the grooves may expose the first signal line, and the first connection patterns may contact the first signal line through the grooves.

In an embodiment, the second pad area may comprise a second signal line extended from the second display area, and holes exposing the second signal line, and the second connection patterns may contact the second signal line through the holes.

In an embodiment, the tiled display may further comprise anisotropic conductive films disposed between the first connection patterns and the second connection patterns.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
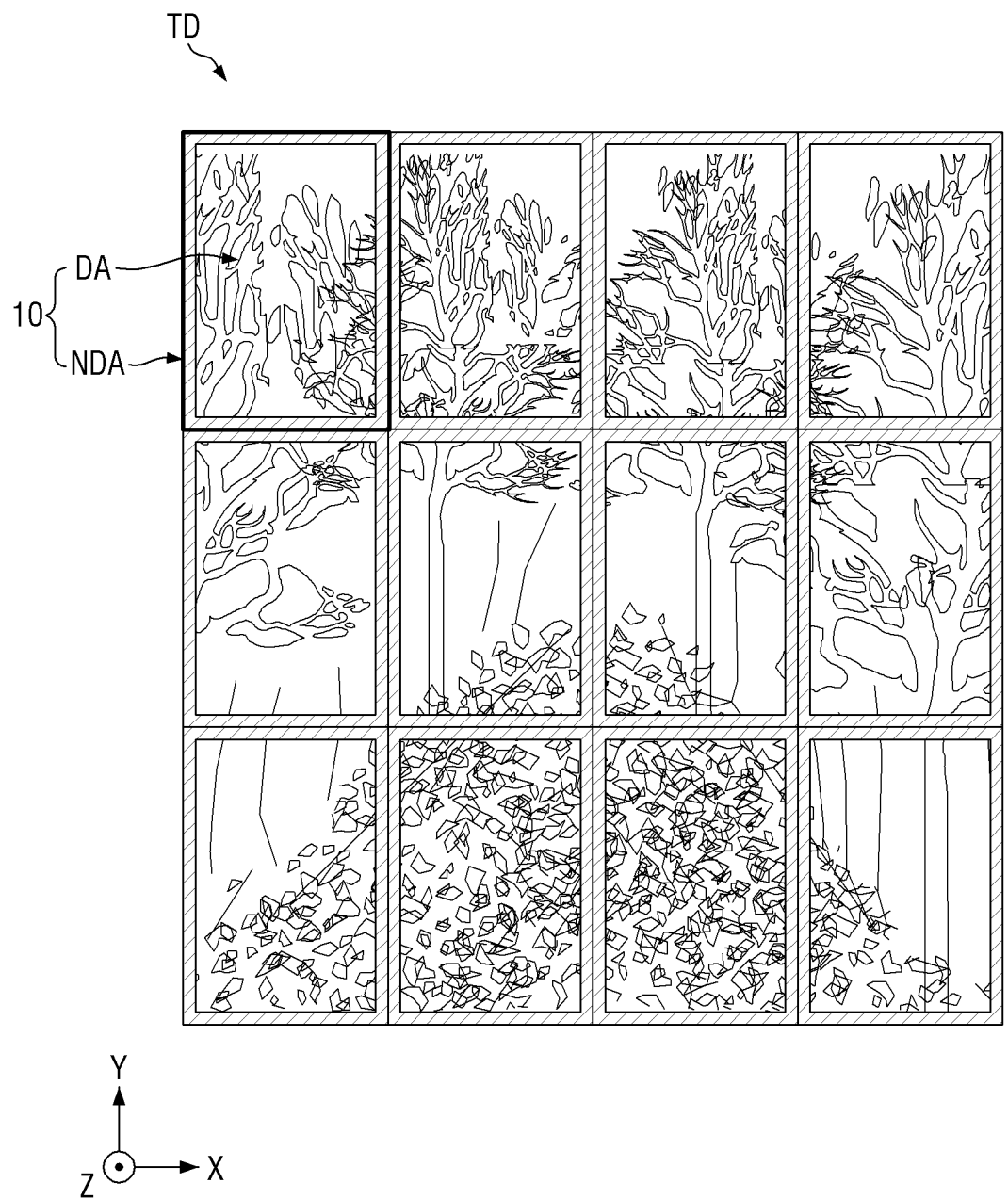
FIG. 1 is a plan view schematically showing a tiled display according to an embodiment of the disclosure.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technical interlocking and driving may be possible. Each embodiment may be implemented independently of each other or may be implemented together in an association.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, extending under, covering, or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an element is referred to as being "in contact" or "contacted" or the like to another element, the element may be in "electrical contact" or in "physical contact" with another element. Such contact may be "direct contact" where no intervening elements may be present, or "indirect contact" where intervening elements may be present.

When a layer is referred to as being "on" another layer or substrate, it can be directly on the other layer or substrate, or intervening layers may also be present.

"About", "approximately", and "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view schematically showing a tiled display according to an embodiment of the disclosure.

Referring to FIG. 1, a tiled display TD may include multiple display devices 10. The display devices 10 may be arranged in, but are not limited to, a lattice pattern. The display devices 10 may be connected in a first direction (x-axis direction) or a second direction (y-axis direction), and the tiled display TD may have a certain shape. For example, the display devices 10 may all have the same size. It is, however, to be understood that the disclosure is not limited thereto. As another example, the display devices 10 may have different sizes.

Each of the display devices 10 may have a rectangular shape including longer sides and shorter sides. The display devices 10 may be arranged such that the longer sides or the shorter sides of the display devices 10 may be connected with one another. Some of the display devices 10 may be disposed on an edge of the tiled display TD to form a side of the tiled display TD. Some others of the display devices 10 may be disposed at a corner of the tiled display TD, and may form two adjacent sides of the tiled display TD. Still some others of the display devices 10 may be disposed on the inner side of the tiled display TD and may be surrounded by other display devices 10.

Each of the display devices 10 may include a display area DA and a non-display area NDA. The display area DA may include pixels to display images. The non-display area NDA may be disposed around the display area DA to surround the display area DA, and may not display an image.

The tiled display TD may have, but is not limited to, a generally planar shape. The tiled display TD may have a three-dimensional shape, giving a viewer a three-dimensional experience. For example, in case that the tiled display TD has a three-dimensional shape, at least some of the display devices 10 may have a curved shape. As another example, the display devices 10 may have a flat shape and may be connected with one another at an angle, so that the tiled display TD may have a three-dimensional shape.

The tiled display TD may be formed by connecting non-display areas NDA of the adjacent display devices 10 with one another. The display devices 10 may be connected with one another through a bonding member or an adhesive member. Accordingly, the non-display area NDA between the display devices 10 may be surrounded by adjacent display areas DA. The display areas DA of the display devices 10 may be so close to one another that a viewer cannot recognize the non-display areas NDA between the display devices 10 or the boundaries between the display devices 10. The reflectivity of external light at the display areas DA of the display devices 10 may be substantially equal to the reflectivity of external light at the non-display areas NDA between the display devices 10. Accordingly, the tiled display TD can allow a viewer to get immersed into the images by eliminating seams between the display devices 10 by way of preventing the non-display areas NDA or the boundaries between the display devices 10 from being perceived.

Figure 2:
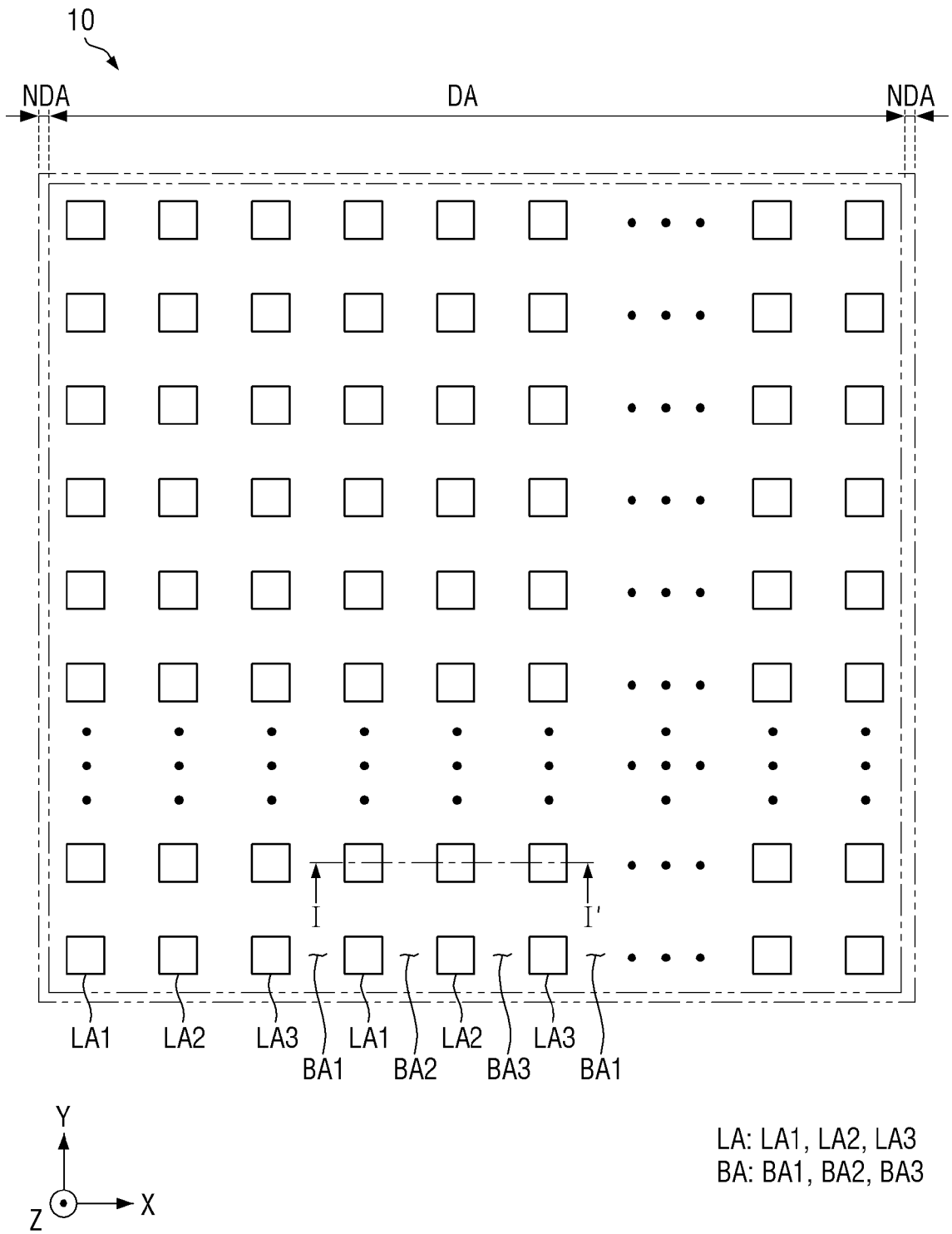
FIG. 2 is a plan view schematically showing a display device according to an embodiment of the disclosure.

FIG. 2 is a plan view schematically showing a display device according to an embodiment of the disclosure.

Referring to FIG. 2, the display device 10 may include pixels arranged of rows and columns in the display area DA. Each of the pixels may include a light-emitting area LA defined by a pixel defining layer, and may emit light having a peak wavelength through the light-emitting area LA. For example, the display area DA of each of the display devices 10 may include first to third light-emitting areas LA1, LA2, and LA3. In each of the first to third light-emitting areas LA1, LA2 and LA3, light generated by a light-emitting element of the display device 10 may exit out of the display device 10.

The first to third light-emitting areas LA1, LA2, and LA3 may emit light having a peak wavelength to the outside of the display device 10. The first light-emitting area LA1 may emit light of a first color, the second light-emitting area LA2 may emit light of a second color, and the third light-emitting area LA3 may emit light of a third color. For example, the light of the first color may be red light having a peak wavelength in the range of about 610 to about 650 nm, the light of the second color may be green light having a peak wavelength in the range of about 510 to about 550 nm, and the light of the third color may be blue light having a peak wavelength in the range of about 440 to about 480 nm. It is, however, to be understood that the disclosure is not limited thereto.

The first to third light-emitting areas LA1, LA2, and LA3 may be arranged repeatedly and sequentially along the first direction (X-axis direction) of the display area DA. For example, the width of the first light-emitting area LA1 in the first direction (X-axis direction) may be larger than the width of the second light-emitting region LA2 in the first direction. The width of the second light-emitting area LA2 in the first direction may be larger than the width of the third light-emitting area LA3 in the first direction. As another example, the width of the first light-emitting area LA1 in the first direction (X-axis direction), the width of the second light-emitting area LA2 in the first direction, and the width of the third light-emitting area LA3 in the first direction may be substantially all equal.

The area of the first light-emitting area LA1 may be larger than the area of the second light-emitting area LA2, and the area of the second light-emitting area LA2 may be larger than the area of the third light-emitting area LA3. As another example, the area of the first light-emitting area LA1, the area of the second light-emitting area LA2 and the area of the third light-emitting area LA3 may be substantially all equal.

The display area DA of the display device 10 may include light-blocking areas BA surrounding the light-emitting areas LA. For example, the display area DA may include first to third light blocking areas BA1, BA2, and BA3. The first to third light blocking areas BA1, BA2 and BA3 may be disposed on a side of the first to third light-emitting areas LA1, LA2 and LA3, respectively, thereby preventing mixture of the lights emitted from the first to third light-emitting areas LA1, LA2 and LA3.

Figure 3:
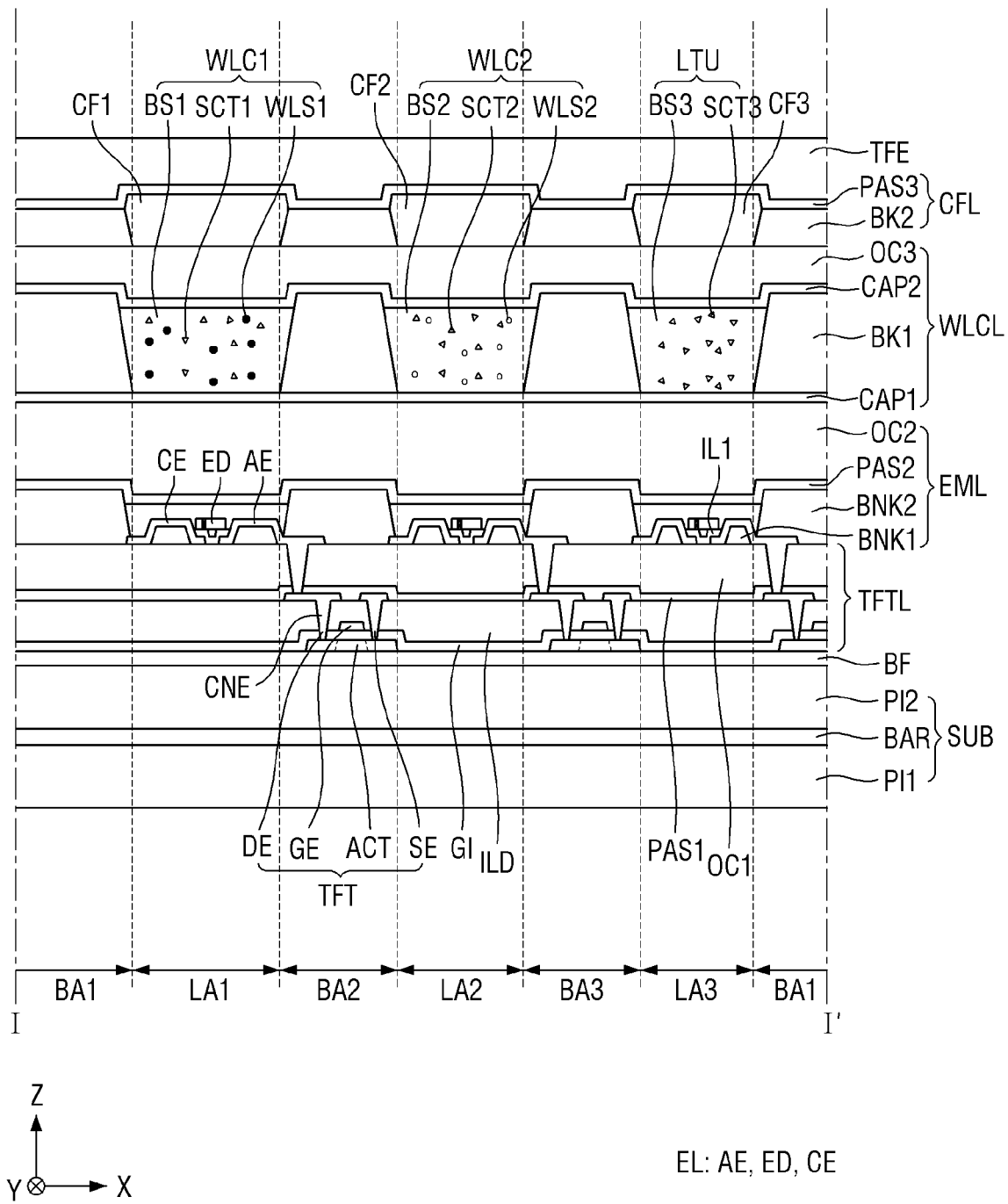
FIG. 3 is a schematic cross-sectional view, taken along line I-I' of FIG. 2.

FIG. 3 is a schematic cross-sectional view, taken along line I-I' of FIG. 2.

Referring to FIG. 3, the display area DA of each of the display devices 10 may include first to third emission areas LA1, LA2, and LA3. In each of the first to third light-emitting areas LA1, LA2 and LA3, light generated by light-emitting diodes ED of the display device 10 may exit out of the display device 10.

The display device 10 may include a substrate SUB, a buffer layer BF, a thin-film transistor layer TFTL, an emission element layer EML, a wavelength conversion layer WLCL, a color filter layer CFL, and an encapsulation layer TFE.

The substrate SUB may include a first base substrate PI1, a barrier layer BAR, and a second base substrate PI2. The first base substrate PI1 and the second base substrate PI2 may be formed of an insulating material such as a polymer resin. For example, the first and second base substrates PI1 and PI2 may be flexible substrates that can be bent, folded and/or rolled. The first base substrate PI1 and the second base substrate PI2 may include, but are not limited to, polyimide PI. The barrier layer BAR may be disposed between the first base substrate PI1 and the second base substrate PI2, and may be implemented as an inorganic layer capable of preventing permeation of air or moisture. For example, the barrier layer BAR may include inorganic films stacked on one another alternately.

The buffer layer BF may be disposed on the substrate SUB. The buffer layer BF may be formed of an inorganic film that can prevent the permeation of air or moisture. For example, the buffer layer BF may include inorganic films stacked on one another alternately.

The thin-film transistor layer TFTL may include a thin-film transistor TFT, a gate insulator GI, an interlayer dielectric layer ILD, a connection electrode CNE, a first passivation layer PAS1, and a first planarization layer OC1.

The thin-film transistor TFT may be disposed on the buffer layer BF, and may form a pixel circuit of each of multiple pixels. For example, the thin-film transistor TFT may be a driving transistor or a switching transistor of the pixel circuit. The thin-film transistor TFT may include a semiconductor region ACT, a gate electrode GE, a source electrode SE, and a drain electrode DE.

The semiconductor region ACT, the source electrode SE and the drain electrode DE may be disposed on the buffer layer BF. The semiconductor region ACT may overlap the gate electrode GE in the thickness direction and may be insulated from the gate electrode GE by the gate insulator GI. The source electrode SE and the drain electrode DE may be formed by converting the material of the semiconductor region ACT into a conductor.

The gate electrode GE may be disposed on the gate insulator GI. The gate electrode GE may overlap the semiconductor region ACT with the gate insulator GI interposed therebetween.

The gate insulator GI may be disposed on the semiconductor region ACT, the source electrode SE and the drain electrode DE. For example, the gate insulator GI may cover the semiconductor region ACT, the source electrode SE, the drain electrode DE and the buffer layer BF, and may insulate the semiconductor region ACT from the gate electrode GE. The gate insulator GI may include contact holes through which the connection electrodes CNE pass.

The interlayer dielectric layer ILD may be disposed over the gate electrode GE. For example, the interlayer dielectric layer ILD may include contact holes through which the connection electrodes CNE pass. The contact holes of the interlayer dielectric layer ILD may be connected to the contact holes of the gate insulator GI.

The connection electrodes CNE may be disposed on the interlayer dielectric layer ILD. The connection electrode CNE may connect the drain electrode DE of the thin-film transistor TFT with a first electrode AE of the light-emitting element EL. The connection electrode CNE may come in contact with the drain electrode DE through the contact hole formed in the gate insulator GI and the interlayer dielectric layer ILD.

The first passivation layer PAS1 may be disposed over the connection electrode CNE to protect the thin-film transistor TFT. For example, the first passivation layer PAS1 may include a contact hole through which the first electrode AE of the light-emitting element EL passes.

The first planarization layer OC1 may be disposed on the first passivation layer PAS1 to provide a flat surface over the thin-film transistor layer TFTL. For example, the first planarization layer OC1 may include a contact hole through which the first electrode AE of the light-emitting element EL passes. The contact hole in the first planarization layer OC1 may be connected to the contact hole in the first passivation layer PAS1.

The emission element layer EML may include a light-emitting element EL, a first bank BNK1, a second bank BNK2, a second passivation layer PAS2, and a second planarization layer OC2.

The light-emitting element EL may be disposed on the thin-film transistor TFT. The light-emitting element EL may include a first electrode AE, a second electrode CE, and a light-emitting diode ED.

The first electrode AE may be disposed on the first planarization layer OC1. For example, the first electrode AE may be disposed on the first bank BNK1 disposed on the first planarization layer OC1 to cover the first bank BNK1. The first electrode AE may be disposed to overlap one of the first to third emission areas LA1, LA2 and LA3 defined by the second bank BNK2. The first electrode AE may be connected to the drain electrode DE of the thin-film transistor TFT. The first electrode AE may be, but is not limited to, an anode electrode of the light-emitting element EL.

The second electrode CE may be disposed on the first planarization layer OC1 such that it may be spaced apart from the first electrode AE. For example, the second electrode CE may be disposed on the first bank BNK1 disposed on the first planarization layer OC1 to cover the first bank BNK1. The second electrode CE may be disposed to overlap one of the first to third light-emitting areas LA1, LA2 and LA3 defined by the second bank BNK2. For example, the second electrode CE may receive a common voltage applied to all pixels. The second electrode CE may be, but is not limited to, a cathode electrode of the light-emitting element EL.

The first insulating layer IL1 may cover a portion of the first electrode AE and a portion of the second electrode CE adjacent to each other and may insulate the first and second electrodes AE and CE from each other.

The light-emitting diode ED may be disposed between the first electrode AE and the second electrode CE above the first planarization layer OC1. The light-emitting diode ED may be disposed on the first insulating layer ILL Ends of the light-emitting diodes ED may be connected to the first electrode AE while other ends of the light-emitting diodes ED may be connected to the second electrode CE. For example, the light-emitting diodes ED may include active layers having a same material so that they may emit light of the same wavelength or light of the same color. The light emitted from each of the first to third light-emitting areas LA1, LA2 and LA3 may have the same color. For example, the light-emitting diodes ED may emit light of the third color or blue light having a peak wavelength in the range of about 440 nm to about 480 nm. Therefore, the emission element layer EML may emit light of the third color or blue light.

The second bank BNK2 may be disposed on the first planarization layer OC1 to define first to third emission areas LA1, LA2, and LA3. For example, the second bank BNK2 may surround each of the first to third emission areas LA1, LA2 and LA3. It is, however, to be understood that the disclosure is not limited thereto. The second bank BNK2 may separate and insulate the first electrode AE or the second electrode CE of a light-emitting element EL from that of an adjacent light-emitting element EL. The second bank BNK2 may be disposed in the first to third light blocking areas BA1, BA2, and BA3.

The second passivation layer PAS2 may be disposed on the light-emitting elements EL and the second bank BNK2. The second passivation layer PAS2 may cover the light-emitting elements EL to protect the light-emitting elements EL. The second passivation layer PAS2 can prevent permeation of impurities such as moisture and air from outside to prevent damage to the light-emitting elements EL.

The second planarization layer OC2 may be disposed on the second passivation layer PAS2 to provide a flat surface over the emission element layer EML. The second planarization layer OC2 may include an organic material. For example, the second planarization layer OC2 may be at least one of an acrylic resin, an epoxy resin, a phenol resin, a polyamide resin, and a polyimide resin.

The wavelength conversion layer WLCL may include a first capping layer CAP1, a first light-blocking member BK1, a first wavelength-converting part WLC1, a second wavelength-converting part WLC2, a light-transmitting part LTU, a second cap layer CAP2, and a third planarization layer OC3.

The first capping layer CAP1 may be disposed on the second planarization layer OC2 of the emission element layer EML. The first capping layer CAP1 may seal the lower surfaces of the first and second wavelength converters WLC1 and WLC2 and the light transmitting part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide and silicon oxynitride.

The first light blocking member BK1 may be disposed in the first to third light blocking areas BA1, BA2 and BA3 on the first capping layer CAP1. The first light blocking member BK1 may overlap the second bank BNK2 in the thickness direction. The first light-blocking member BK1 can block the transmission of light. The first light-blocking member BK1 can improve the color gamut by preventing lights from intruding and mixing among the first to third light-emitting areas LA1, LA2 and LA3. The first light blocking member BK1 may be arranged in a lattice shape surrounding the first to third light-emitting regions LA1, LA2, and LA3 when viewed from the top.

The first light-blocking member BK1 may include an organic light-blocking material and a liquid repellent component. Herein, the liquid repellent component may be composed of a fluorine-containing monomer or a fluorine-containing polymer, and specifically, may include a fluorine-containing aliphatic polycarbonate. For example, the first light-blocking member BK1 may be formed of a black organic material including the liquid repellent component. The first light-blocking member BK1 may be formed via coating and exposure processes for an organic light-blocking material containing a liquid repellent component, etc.

Since the first light-blocking member BK1 may include the liquid repellent component, the first and second wavelength converting parts WLC1 and WLC2 and the light-transmitting part LTU may be separated so that they can correspond to the respective light-emitting areas LA. For example, in case that the first and second wavelength conversion parts WLC1 and WLC2 and the light-transmitting part LTU may be formed by an inkjet method, an ink composition may flow on the upper surface of the first light-blocking member BK1. In this regard, the first light-blocking member BK1 may include the liquid-repellent component, and thus it may be possible to guide the ink composition to flow to the light-emitting areas. Therefore, the first light-blocking member BK1 can prevent the ink composition from mixing.

The first wavelength converter WLC1 may be disposed in the first light-emitting area LA1 on the first capping layer CAP1. The first wavelength converter WLC1 may be surrounded by the first light blocking member BK1. The first wavelength-converting part WLC1 may include a first base resin BS1, first scatterers SCT1, and first wavelength shifters WLS1.

The first base resin BS1 may include a material having a relatively high light transmittance. The first base resin BS1 may be formed of a transparent organic material. For example, the first base resin BS1 may include at least one organic material among an epoxy resin, an acrylic resin, a cardo resin, and an imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO) and tin oxide ($SnO_2$) or may include organic particles such as an acrylic resin and a urethane resin, or a combination thereof. The first scatters SCT1 may scatter light in random directions irrespective of the incidence direction of the incident light, without substantially changing the peak wavelength of the incident light.

The first wavelength shifters WLS1 may convert or shift the peak wavelength of the incident light to a first peak wavelength. For example, the first wavelength shifters WLS1 may convert blue light provided from the display device 10 into red light having a single peak wavelength in the range of about 610 nm to about 650 nm, and emit the light. The first wavelength shifters WLS1 may be quantum dots, quantum rods, or phosphor. The quantum dots may be particulate matter that emits a color as electrons transition from the conduction band to the valence band.

For example, the quantum dots may be semiconductor nanocrystalline material. The quantum dots may have a specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

For example, the quantum dots may have a core-shell structure including a core comprising the nanocrystals and a shell surrounding the core. The shells of the quantum dots may serve as a protective layer for maintaining the semiconductor properties by preventing chemical denaturation of the core and as a charging layer for imparting electrophoretic properties to the quantum dots. The shell may be either a single layer or multiple layers. At the interface between the core and the shell, the gradient of the concentrate of atoms in the shell may decrease toward the center. The shell of the quantum dot may be formed of an oxide of a metal or a non-metal, a semiconductor compound, a combination thereof, etc.

The light emitted from the first wavelength shifters WLS1 may have a full width of half maximum (FWHM) of the emission wavelength spectrum of about 45 nm or less, about 40 nm or less, or about 30 nm or less. In this manner, the color purity and color gamut of the colors displayed by the display device 10 can be further improved. The light emitted from the first wavelength shifts WLS1 may travel in different directions regardless of the incidence direction of the incident light. Accordingly, the side visibility of the red color displayed in the first light-emitting area LA1 can be improved.

A part of the blue light emitted from the emission element layer EML may pass through the first wavelength-converting part WLC1 without being converted into red light by the first wavelength shifters WLS1. In case that such blue light may be incident on the first color filter CF1, it can be blocked by the first color filter CF1. On the other hand, red light converted by the first wavelength-converting part WLC1 may pass through the first color filter CF1 to exit to the outside. Accordingly, the first light-emitting area LA1 may emit red light.

The second wavelength-converting part WLC2 may be disposed in the second light-emitting area LA2 on the first capping layer CAP1. The second wavelength-converting part WLC2 may be surrounded by the first light-blocking member BK1. The second wavelength-converting part WLC2 may include a second base resin BS2, second scatterers SCT2, and second wavelength shifters WLS2.

The second base resin BS2 may include a material having a relatively high light transmittance. The second base resin BS2 may be formed of a transparent organic material. For example, the second base resin BS2 and the first base resin BS1 may be formed of a same material, or the second base resin BS2 may be formed of one of the above-listed materials of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 and the first scatterers SCT1 may be formed of a same material, or the second scatterers SCT2 may be formed of one of the above-listed materials of the first scatterers SCT1. The second scatters SCT2 may scatter light in random directions irrespective of the incidence direction of the incident light, without substantially changing the peak wavelength of the incident light.

The second wavelength shifters WLS2 may convert or shift the peak wavelength of the incident light to a second peak wavelength that may be different from the first peak wavelength of the first wavelength shifters WLS1. For example, the second wavelength shifters WLS2 may convert blue light provided from the display device 10 into blue light having a single peak wavelength in the range of about 510 nm to about 550 nm, and emit the light. The second wavelength shifters WLS2 may be quantum dots, quantum rods, or phosphor. The second wavelength shifters WLS2 may include the above-listed materials of the first wavelength shifters WLS1. The wavelength conversion range of the second wavelength shifters WLS2 may be formed of quantum dots, quantum rods, phosphor, or a combination thereof so that it may be different from the wavelength conversion range of the first wavelength shifters WLS1.

The light-transmitting part LTU may be disposed in the third light-emitting area LA3 on the first capping layer CAP1. The light-transmitting part LTU may be surrounded by the first light-blocking member BK1. The light-transmitting part LTU may transmit the incident light without converting its peak wavelength. The light-transmitting part LTU may include a third base resin BS3 and third scatterers SCT3.

The third base resin BS3 may include a material having a relatively high light transmittance. The third base resin BS3 may be formed of a transparent organic material. For example, the third base resin BS3, the first base resin BS1, and/or the second base resin BS2 may be formed of a same material, or the third base resin BS3 may be formed of one of the above-listed materials of the first base resin BS1 and/or the second base resin BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3, the first scatterers SCT1, and/or the second scatterers SCT2 may be formed of a same material, or the third scatterers SCT3 may be formed of one of the above-listed materials of the first scatterers SCT1 and/or the second scatterers SCT2. The third scatters SCT3 may scatter light in random directions irrespective of the incidence direction of the incident light, without substantially changing the peak wavelength of the incident light.

The wavelength conversion layer WLCL may be disposed on (e.g., directly on) the second planarization layer OC2 of the emission element layer EML, so that the display device 10 may not require a separated substrate for the first and second wavelength-converting parts WLC1 and WLC2 and the light-transmitting part LTU. Therefore, the first and second wavelength-converting parts WLC1 and WLC2 and the light-transmitting part LTU can be easily aligned with the first to third light-emitting areas LA1, LA2 and LA3, respectively, so that the thickness of the display device 10 can be reduced relatively.

The second capping layer CAP2 may cover the first and second wavelength converting parts WLC1 and WLC2, the light-transmitting part LTU, and the first light-blocking member BK1. For example, the second capping layer CAP2 may seal the first and second wavelength-converting parts WLC1 and WLC2 and the light-transmitting part LTU to thereby prevent damage or contamination to the first and second wavelength-converting parts WLC1 and WLC2 and the light-transmitting part LTU. The second capping layer CAP2 and the first capping layer CAP1 may be formed of a same material, or the second capping layer CAP2 may be formed of the above-listed materials of the first capping layer CAP1.

The third planarization layer OC3 may be disposed on the second capping layer CAP2 to provide the flat top surfaces of the first and second wavelength converting parts WLC1 and WLC2 and the light-transmitting part LTU. The third planarization layer OC3 may include an organic material. For example, the third planarization layer OC3 may be at least one of an acrylic resin, an epoxy resin, a phenol resin, a polyamide resin, and a polyimide resin.

The color filter layer CFL may include a second light-blocking member BK2, the first to third color filters CF1, CF2 and CF3, and the third passivation layer PAS3.

The second light-blocking member BK2 may be disposed in the first to third light-blocking areas BA1, BA2 and BA3 on the third planarization layer OC3 of the wavelength conversion layer WLCL. The second light-blocking member BK2 may overlap the first light-blocking member BK1 or the second bank BNK2 in the thickness direction. The second light-blocking member BK2 can block the transmission of light. The second light-blocking member BK2 can improve the color gamut by preventing lights from intruding and mixing among the first to third light-emitting areas LA1, LA2 and LA3. The second light-blocking member BK2 may be arranged in a lattice shape surrounding the first to third light-emitting regions LA1, LA2, and LA3 when viewed from the top.

The first color filter CF1 may be disposed in the first light-emitting area LA1 on the third planarization layer OC3. The first color filter CF1 may be surrounded by the second light blocking member BK2. The first color filter CF1 may overlap the first wavelength converter WLC1 in the thickness direction. The first color filter CF1 may selectively transmit light of the first color (e.g., red light) and may block and absorb light of the second color (e.g., green light) and light of the third color (e.g., blue light). For example, the first color filter CF1 may be a red color filter and may include a red colorant. The red colorant may be formed of a red dye or a red pigment.

The second color filter CF2 may be disposed in the second light-emitting area LA2 on the third planarization layer OC3. The second color filter CF2 may be surrounded by the second light-blocking member BK2. The second color filter CF2 may overlap the second wavelength converter WLC2 in the thickness direction. The second color filter CF2 may selectively transmit light of the second color (e.g., green light) and may block and absorb light of the first color (e.g., red light) and light of the third color (e.g., blue light). For example, the second color filter CF2 may be a green color filter and may include a green colorant. The green colorant may be formed of a green dye or a green pigment.

The third color filter CF3 may be disposed in the third light-emitting area LA3 on the third planarization layer OC3. The third color filter CF3 may be surrounded by the second light-blocking member BK2. The third color filter CF3 may overlap the light-transmitting part LTU in the thickness direction. The third color filter CF3 may selectively transmit light of the third color (e.g., blue light) and may block and absorb light of the first color (e.g., red light) and light of the second color (e.g., green light). For example, the third color filter CF3 may be a blue color filter and may include a blue colorant. The blue colorant may be formed of a blue dye or a blue pigment.

The first to third color filters CF1, CF2 and CF3 may absorb a part of the light introduced from the outside of the display device 10 to reduce reflection of external light. Accordingly, the first to third color filters CF1, CF2 and CF3 can prevent color distortion due to reflection of external light.

The first to third color filters CF1, CF2 and CF3 may be disposed on (e.g., directly on) the third planarization layer OC3 of the wavelength conversion layer WLCL, and thus the display device 10 may not require a separate substrate for the first to third color filters CF1, CF2 and CF3. Therefore, the thickness of the display device 10 can be relatively reduced.

The third passivation layer PAS3 may cover the first to third color filters CF1, CF2 and CF3. The third passivation layer PAS3 can protect the first to third color filters CF1, CF2 and CF3.

The encapsulation layer TFE may be disposed on the third passivation layer PAS3 of the color filter layer CFL. The encapsulation layer TFE may cover the upper and side surfaces of a display layer. For example, the encapsulation layer TFE may include at least one inorganic layer to prevent permeation of oxygen or moisture. The encapsulation layer TFE may include at least one organic layer to protect the display device 10 from foreign substances such as dust.

Figure 4:
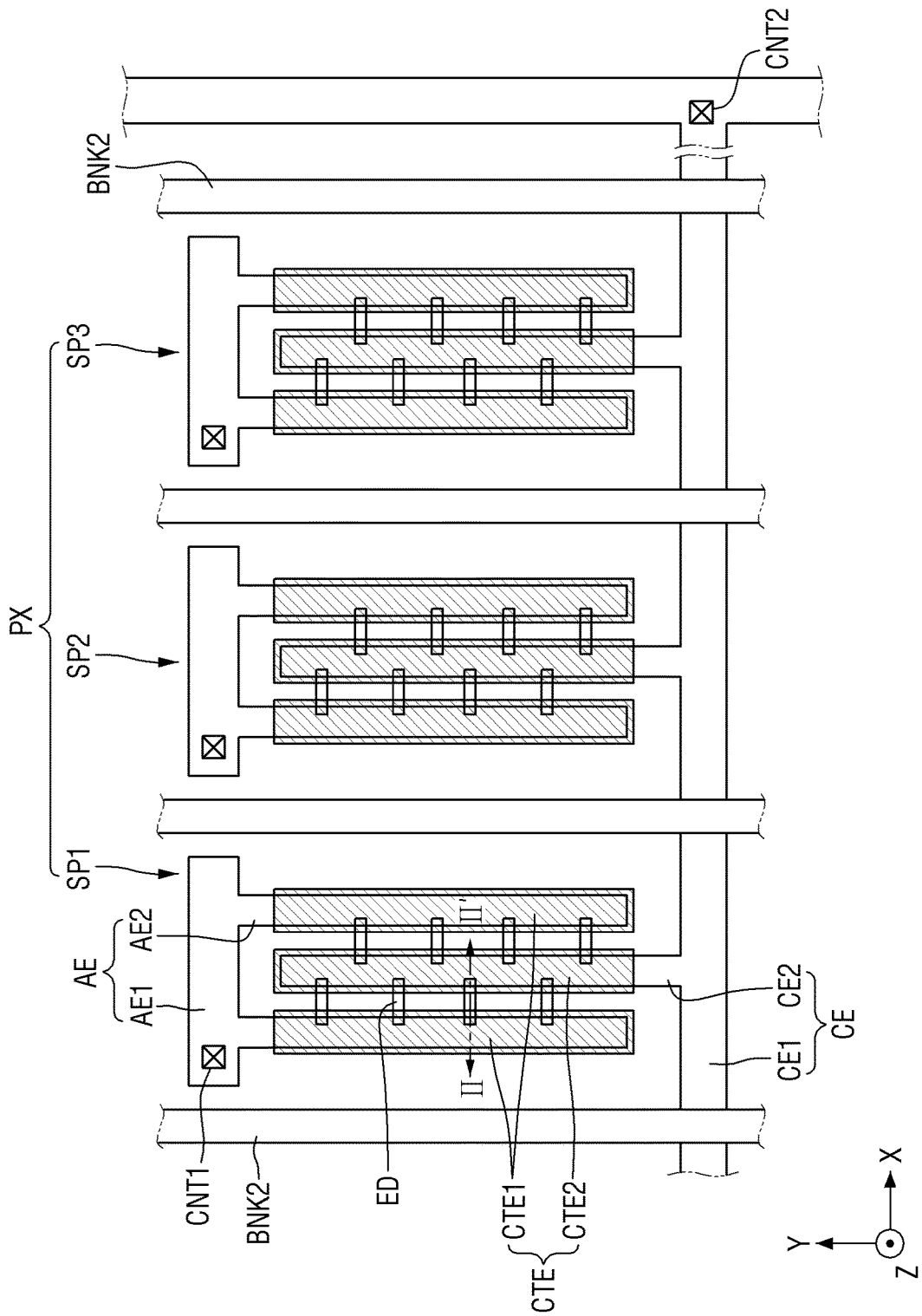
FIG. 4 is a plan view schematically showing a pixel of a display device according to an embodiment of the disclosure.

FIG. 4 is a plan view schematically showing a pixel of a display device according to an embodiment of the disclosure.

Referring to FIG. 4, each of the pixels PX may include first to third sub-pixels SP1, SP2 and SP3. The first to third sub-pixels SP1, SP2 and SP3 may correspond to the first to third light-emitting areas LA1, LA2 and LA3, respectively. The light-emitting diodes ED of the first to third sub-pixels SP1, SP2 and SP3 may emit light through the first to third light-emitting areas LA1, LA2 and LA3, respectively.

The first to third sub-pixels SP1, SP2, and SP3 may emit light of the same color. For example, the first to third sub-pixels SP1, SP2 and SP3 may include the light-emitting diodes ED of the same type, and may emit light of the third color or blue light. As another example, the first sub-pixel SP1 may emit light of the first color or red light, the second sub-pixel SP2 may emit light of the second color or green light, and the third sub-pixel SP3 may emit light of the third color or blue light.

Each of the first to third sub-pixels SP1, SP2 and SP3 may include the first and second electrodes AE and CE, light-emitting diodes ED, contact electrodes CTE, and second banks BNK2.

The first and second electrodes AE and CE may be electrically connected to the light-emitting diodes ED to receive a voltage, and the light-emitting diodes ED may emit light of a certain wavelength band. At least a portion of the first and second electrodes AE and CE may form an electric field in the pixel SP, and the light-emitting diodes ED may be aligned by the electric field.

For example, the first electrode AE may be a pixel electrode separated for each of the first to third sub-pixels SP1, SP2 and SP3, and the second electrode CE may be a common electrode extended across the first to third sub-pixel SP1, SP2 and SP3. One of the first electrode AE and the second electrode CE may be the anode electrode of the light-emitting diodes ED, while another may be the cathode electrode of the light-emitting diodes ED.

The first electrode AE may include a first electrode stem AE1 extended in the first direction (x-axis direction), and at least one first electrode branch AE2 branching off from the first electrode stem AE1 and extended in the opposite direction to the second direction (y-axis direction).

The first electrode stem AE1 of each of the first to third sub-pixels SP1, SP2 and SP3 may be spaced apart from the first electrode stem AE1 of an adjacent sub-pixel, and the first electrode stem AE1 may be disposed on an imaginary extension line with the first electrode stem AE1 of the sub-pixel adjacent in the first direction (x-axis direction). The first electrode stems AE1 of the first to third sub-pixels SP1, SP2 and SP3 may receive different signals, respectively, and may be driven individually.

The first electrode branch AE2 may branch off from the first electrode stem AE1 and may be extended in the opposite direction to the second direction (y-axis direction). An end of the first electrode branch AE2 may be connected to the first electrode stem AE1, while another end of the first electrode branch AE2 may be spaced apart from the second electrode stem CE1 opposed to the first electrode stem AE1.

The second electrode CE may include a second electrode stem CE1 extended in the first direction (x-axis direction), and a second electrode branch CE2 branching off from the second electrode stem CE1 and extended in the second direction (y-axis direction). The second electrode stem CE1 of each of the first to third sub-pixels SP1, SP2 and SP3 may be connected to the second electrode stem CE1 of an adjacent sub-pixel. The second electrode stem CE1 may be extended in the first direction (x-axis direction) to traverse the sub-pixels PX. The second electrode stem CE1 may be connected to a portion extended in a direction at the outer portion of the display area DA or in the non-display area NDA.

The second electrode branch CE2 may be spaced apart from and face the first electrode branch AE2. An end of the second electrode branch CE2 may be connected to the second electrode stem CE1, while another end of the second electrode branch CE2 may be spaced apart from the first electrode stem AE1.

The first electrode AE may be electrically connected to the thin-film transistor layer TFTL of the display device 10 through a first contact hole CNT1, and the second electrode CE may be electrically connected to the thin-film transistor layer TFTL of the display device 10 through a second contact hole CNT2. For example, the first contact hole CNT1 may be formed in each of the first electrode stems AE1, and the second contact hole CNT2 may be formed in the second electrode stem CE1. It is, however, to be understood that the disclosure is not limited thereto.

The second bank BNK2 may be disposed at the boundary between the pixels PX. The first electrode stems AE1 may be spaced apart from one another with respect to the second banks BNK2. The second banks BNK2 may be extended in the second direction (y-axis direction) and may be disposed at the boundaries of the pixels PX arranged in the first direction (x-axis direction). The second banks BNK2 may be disposed at the boundaries of the pixels PX arranged in the second direction (y-axis direction) as well. The second banks BNK2 may define the boundaries of the pixels PX.

When an ink in which the light-emitting diodes ED may be dispersed is ejected during the process of fabricating the display device 10, the second bank BNK2 can prevent the ink from flowing over the boundaries of the pixels SP. The second banks BNK2 can separate the inks in which different light-emitting diodes ED may be dispersed from each other so that the inks are not mixed with each other.

The light-emitting diodes ED may be disposed between the first electrode AE and the second electrode CE. Ends of the light-emitting diodes ED may be connected to the first electrode AE while other ends of the light-emitting diodes ED may be connected to the second electrode CE. For example, the light-emitting diodes ED may be connected to the first electrode AE through the first contact electrode CTE1 and may be connected to the second electrode CE through the second contact electrode CTE2.

The light-emitting diodes ED may be spaced apart from one another and may be substantially aligned in parallel with one another. The spacing between the light-emitting diodes ED is not particularly limited herein. Some of the light-emitting diodes ED may be disposed adjacent to one another, some others of the light-emitting diodes ED may be spaced apart at a constant spacing, and yet others of the light-emitting diodes ED may be aligned in certain directions with non-uniform densities. For example, the light-emitting diodes ED may be arranged in the direction perpendicular to the direction in which the first electrode branch AE2 or the second electrode branch CE2 may be extended. As another example, the light-emitting diodes ED may be arranged in a direction oblique to the direction in which the first electrode branch AE2 or the second electrode branch CE2 may be extended.

The light-emitting diodes ED may include active layers having the same material so that they may emit light of the same wavelength range or light of the same color. The first to third sub-pixels SP1, SP2 and SP3 may emit light of the same color. For example, the light-emitting diodes ED may emit light of the third color or blue light having a peak wavelength in the range of about 440 nm to about 480 nm. Therefore, the emission element layer EML of the display device 10 may emit light of the third color or blue light. As another example, the first to third sub-pixels SP1, SP2 and SP3 may include the light-emitting diodes ED having different active layers, and may emit lights of different colors.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 with the light-emitting diodes ED. The second contact electrode CTE2 may cover the second electrode branch CE2 and other parts of the light-emitting diodes ED, and may electrically connect the second electrode branch CE2 and the light-emitting diodes ED.

The first contact electrode CTE1 may be disposed on the first electrode branch AE2 and extended in the second direction (Y-axis direction). The first contact electrode CTE1 may be in contact with first ends of the light-emitting diodes ED. The light-emitting diodes ED may be electrically connected to the first electrode AE through the first contact electrode CTE1.

The second contact electrode CTE2 may be disposed on the second electrode branch CE2 and extended in the second direction (Y-axis direction). The second contact electrode CTE2 may be spaced apart from the first contact electrode CTE1 in the first direction (X-axis direction). The second contact electrode CTE2 may be in contact with second ends of the light-emitting diodes ED. The light-emitting diodes ED may be electrically connected to the second electrode CE through the second contact electrode CTE2.

For example, the widths of the first and second contact electrodes CTE1 and CTE2 may be larger than the widths of the first and second electrode branches AE2 and CE2, respectively. As another example, the first and second contact electrodes CTE1 and CTE2 may cover one sides of the first and second electrode branches AE2 and CE2, respectively.

Figure 5:
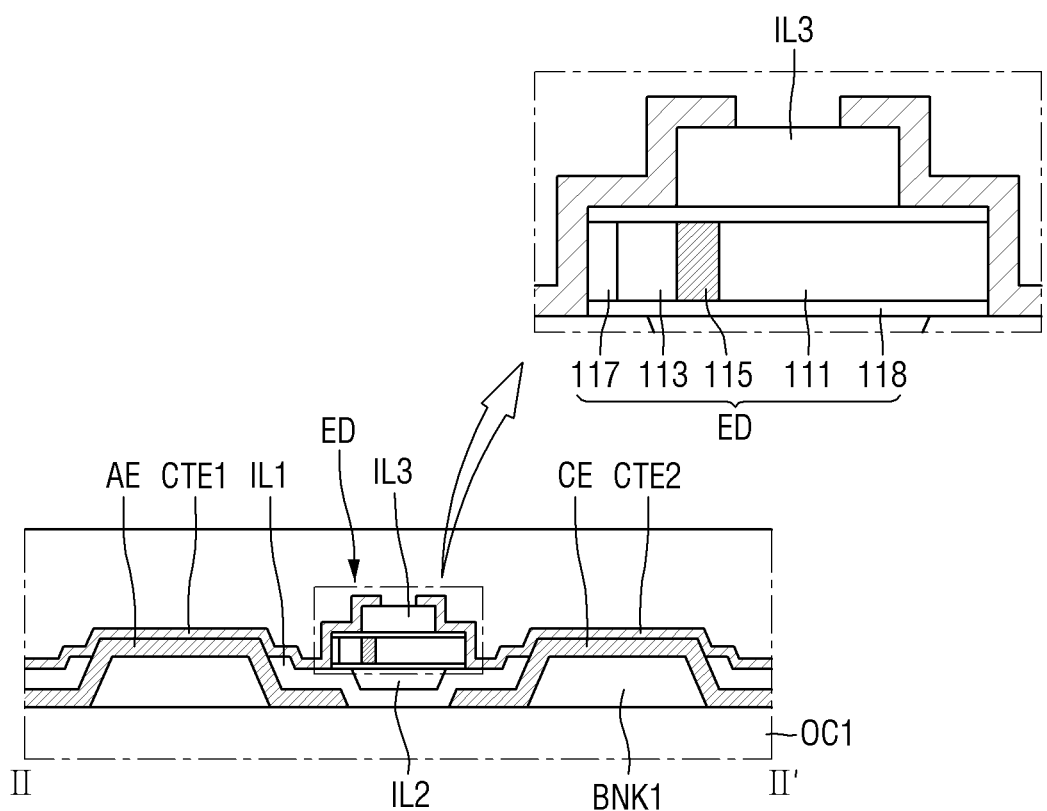
FIG. 5 is a schematic cross-sectional view taken along line II-II' of FIG. 4.

FIG. 5 is a schematic cross-sectional view taken along line II-II' of FIG. 4.

Referring to FIG. 5, the emission element layer EML of the display device 10 may be disposed on the thin-film transistor layer TFTL, and may include first to third insulating layers ILL IL2 and IL3.

The first banks BNK1 may be disposed in the first to third light-emitting areas LA1, LA2 and LA3, respectively. Each of the first banks BNK1 may correspond to the first electrode AE or the second electrode CE. Each of the first and second electrodes AE and CE may be disposed on the respective first bank BNK1. For example, each of the first and second electrode branches AE2 and CE2 may be disposed on the respective first bank BNK1. The first banks BNK1 may include, but are not limited to, polyimide (PI).

The first banks BNK1 may be disposed on the first planarization layer OC1, and the side surfaces of each of the first banks BNK1 may be inclined from the first planarization layer OC1. For example, each of the first and second electrodes AE and CE may contain a material having a high reflectivity, and may be disposed on the inclined surfaces of the first banks BNK1 to reflect the light emitted from the light-emitting element EL toward the upper side of the display device 10.

Referring to FIG. 5 in conjunction with FIG. 4, the first electrode stem AE1 may include the first contact hole CNT1 penetrating through the first planarization layer OC1. The first electrode stem AE1 may be electrically connected to the thin-film transistor TFT through the first contact hole CNT1. Accordingly, the first electrode AE may receive an electric signal from the thin-film transistor TFT.

The second electrode stem CE1 may be extended in the first direction (X-axis direction) and may be disposed in a non-emission area as well where the light-emitting diodes ED may not be disposed. The second electrode stem CE1 may include the second contact hole CNT2 penetrating through the first planarization layer OC1. The second electrode stem CE1 may be electrically connected to a power electrode through the second contact hole CNT2. The second electrode CE may receive an electric signal from the power electrode.

The first and second electrodes AE and CE may include a transparent conductive material. For example, each of the first and second electrodes AE and CE may include, but are not limited to, at least one of indium tin oxide (ITO), indium zinc oxide (IZO), and indium tin-zinc oxide (ITZO).

The first and second electrodes AE and CE may include a conductive material with high reflectivity. For example, the first and second electrodes AE and CE may include a metal having high reflectivity, such as silver (Ag), copper (Cu), aluminum (Al), or a combination thereof. The first and second electrodes AE and CE can reflect light incident from the light-emitting diodes ED toward the upper side of the display device 10.

The first and second electrodes AE and CE may be made up of a stack of one or more transparent conductive materials and one or more metals having high reflectivity or a single layer including them. For example, the first and second electrodes AE and CE may have a stack structure of ITO/silver (Ag)/ITO/IZO, or may be an alloy including aluminum (Al), nickel (Ni), lanthanum (La), etc. It is, however, to be understood that the disclosure is not limited thereto.

The first insulating layer IL1 may be disposed on the first planarization layer OC1, the first electrode AE, and the second electrode CE. The first insulating layer IL1 may partially cover each of the first and second electrodes AE and CE. For example, the first insulating layer IL1 may expose portions of the first and second electrodes AE and CE corresponding to the upper surfaces of the first banks BNK1, and may cover other portions of the first and second electrodes AE and CE that do not correspond to the upper surfaces. Accordingly, the first insulating layer IL1 may include openings exposing portions of the first and second electrodes AE and CE corresponding to the upper surfaces of the first banks BNK1.

For example, the first insulating layer IL1 may include an inorganic insulating material, and may include depressed portions between the first and second electrodes AE and CE. The depressed portions of the first insulating layer IL1 may be filled with the second insulating layer IL2. Accordingly, the second insulating layer IL2 can make the upper surface of the first insulating layer IL1 even, and accordingly the light-emitting diodes ED may be disposed on the first and second insulating layers IL1 and IL2.

The first insulating layer IL1 can protect the first and second electrodes AE and CE and may insulate the first and second electrodes AE and CE from each other. The first insulating layer IL1 can prevent that the light-emitting diodes ED may be in direct contact with other elements and damaged by the other elements.

The light-emitting diodes ED may be disposed between the first electrode AE and the second electrode CE on the first and second insulating layers IL1 and IL2. Ends of the light-emitting diodes ED may be connected to the first electrode AE while other ends of the light-emitting diodes ED may be connected to the second electrode CE. For example, the light-emitting diodes ED may be connected to the first electrode AE through the first contact electrode CTE1 and may be connected to the second electrode CE through the second contact electrode CTE2.

The third insulating layer IL3 may be partially disposed on the light-emitting diodes ED disposed between the first electrode AE and the second electrode CE. The third insulating layer IL3 may partially cover the outer surfaces of the light-emitting diodes ED. The third insulating layer IL3 can protect the light-emitting diodes ED.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 with the light-emitting diodes ED. The second contact electrode CTE2 may cover the second electrode branch CE2 and other parts of the light-emitting diodes ED and may electrically connect the second electrode branch CE2 with the light-emitting diodes ED.

The contact electrodes CTE may include a conductive material. For example, the contact electrodes CTE may include, but are not limited to, ITO, IZO, ITZO, aluminum (Al), etc., or a combination thereof.

Figure 6:
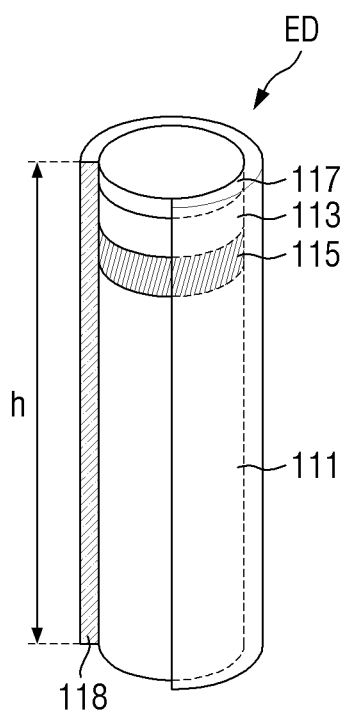
FIG. 6 is a view schematically showing a light-emitting element according to an embodiment of the disclosure.

FIG. 6 is a view schematically showing a light-emitting element according to an embodiment of the disclosure.

Referring to FIG. 6, the light-emitting diodes ED may have a size of a micro-meter or a nano-meter, and may be an inorganic light-emitting diode containing an inorganic material. Inorganic light-emitting diodes may be aligned between two electrodes facing each other as polarities may be created by forming an electric field in a particular direction between the two electrodes.

The light-emitting diode ED may have a shape extended in a direction. The light-emitting diode ED may have a shape of a rod, wire, tube, etc. For example, the light-emitting diode ED may have a cylindrical or rod-like shape. As another example, the light-emitting diode ED may have a variety of shapes including a polygonal column shape such as a cube, a cuboid and a hexagonal column, or a shape that may be extended in a direction with partially inclined portions. The semiconductors included in the light-emitting diode ED may have a structure sequentially arranged or stacked along a direction.

The light-emitting diode ED may include a first semiconductor layer 111, a second semiconductor layer 113, an active layer 115, an electrode layer 117, and an insulating layer 118.

The first semiconductor layer 111 may be an n-type semiconductor. For example, in case that the light-emitting element EL emits blue light, the first semiconductor layer 111 may include a semiconductor material having the following chemical formula: $Al_xGa_yIn_{1-x-y}N$ ($0 \leq x \leq 1$, $0 \leq y \leq 1$, $0 \leq x+y \leq 1$). The first semiconductor layer 111 may be at least one semiconductor material among n-type doped AlGaInN, GaN, AlGaN, InGaN, AlN and InN. The first semiconductor layer 111 may be doped with an n-type dopant such as Si, Ge and Sn. The first semiconductor layer 111 may be n-GaN doped with n-type Si. The length of the first semiconductor layer 111 may range, but is not limited to, from about 1.5 μm to about 5 μm.

The second semiconductor layer 113 may be disposed on the active layer 115. For example, in case that the light-emitting element EL emits blue light or green light, the second semiconductor layer 113 may include a semiconductor material having the following chemical formula: $Al_xGa_yIn_{1-x-y}N$ ($0 \leq x \leq 2$, $0 \leq y \leq 1$, $0 \leq x+y \leq 1$). For example, the second semiconductor layer 113 may be at least one semiconductor material among p-type doped AlGaInN, GaN, AlGaN, InGaN, AlN and InN. The second semiconductor layer 113 may be doped with a p-type dopant such as Mg, Zn, Ca, Se and Ba. The second semiconductor layer 113 may be p-GaN doped with p-type Mg. The length of the second semiconductor layer 113 may range, but is not limited to, from about 0.05 μm to about 0.10 μm.

Each of the first and second semiconductor layers 111 and 113 may be made up of, but are not limited to, a single layer. For example, each of the first and second semiconductor layers 111 and 113 may have multiple layers including a clad layer or a tensile strain barrier reducing (TSBR) layer.

The active layer 115 may be disposed between the first and second semiconductor layers 111 and 113. The active layer 115 may include a material having a single or multiple quantum well structure. In case that the active layer 115 includes a material having the multiple quantum well structure, quantum layers and well layers may be alternately stacked on one another. The active layer 115 may emit light as electron-hole pairs may be combined therein in response to an electrical signal applied through the first semiconductor layer 111 and the second semiconductor layer 113. For example, in case that the active layer 115 emits blue light, it may include a material such as AlGaN and AlGaInN. In case that the active layer 115 has a multi-quantum well structure in which quantum layers and well layers are alternately stacked on one another, the quantum layers may include AlGaN, AlGaInN, etc., and the well layers may include GaN, AlInN, etc., or a combination thereof. The active layer 115 may include AlGaInN as a quantum layer and AlInN as a well layer to emit blue light.

In other embodiments, the active layer 115 may have a structure in which a semiconductor material having a large band gap energy and a semiconductor material having a small band gap energy may be alternately stacked on one another, and may include Group III to Group V semiconductor materials depending on the wavelength range of the emitted light. The light emitted from the active layer 115 is not limited to the blue light. The active layer 115 may emit light of red or green in some implementations. The length of the active layer 115 may range, but is not limited to, from about 0.05 μm to about 0.10 μm.

The light emitted from the active layer 115 may exit in the longitudinal direction of the light-emitting diode ED as well as through both side surfaces. The directivity of light emitted from the active layer 115 may not be limited.

The electrode layer 117 may be an ohmic contact electrode. As another example, the electrode layer 117 may be a Schottky contact electrode. The light-emitting diode ED may include at least one electrode layer 117. The electrode layer 117 can reduce the resistance between the light-emitting diode ED and the electrode or the contact electrodes CTE in case that the light-emitting diode ED is electrically connected to the electrode or the contact electrodes CTE. The electrode layer 117 may include a metal having conductivity. For example, the electrode layer 117 may include at least one of aluminum (Al), titanium (Ti), indium (In), gold (Au), silver (Ag), indium tin oxide (ITO), indium zinc oxide (IZO) and indium tin-zinc oxide (ITZO). The electrode layer 117 may include a semiconductor material doped with n-type or p-type impurities.

The insulating layer 118 may surround the outer surfaces of the semiconductor layers and electrode layers. The insulating layer 118 may surround the outer surface of the active layer 115 and may be extended in the direction in which the light-emitting diode ED may be extended. The insulating layer 118 can protect the light-emitting diode ED. For example, the insulating layer 118 may surround the side surface of the light-emitting diode ED and may expose both ends of the light-emitting diode ED in the longitudinal direction.

The insulating layer 118 may include materials having an insulating property such as silicon oxide (SiOx), silicon nitride (SiNx), silicon oxynitride (SiOxNy), aluminum nitride (AlN), aluminum oxide ($Al_2O_3$), or a combination thereof. Accordingly, the insulating layer 118 can prevent an electrical short-circuit that may occur in case that the active layer 115 comes in contact with an electrode through which an electric signal may be transmitted to the light-emitting element EL. Since the insulating layer 118 protects the outer surface of the light-emitting diode ED, including the active layer 115, it may be possible to prevent a decrease in the luminous efficiency.

Hereinafter, a connecting structure for the above-described tiled display TD will be described in detail.

Figure 7:
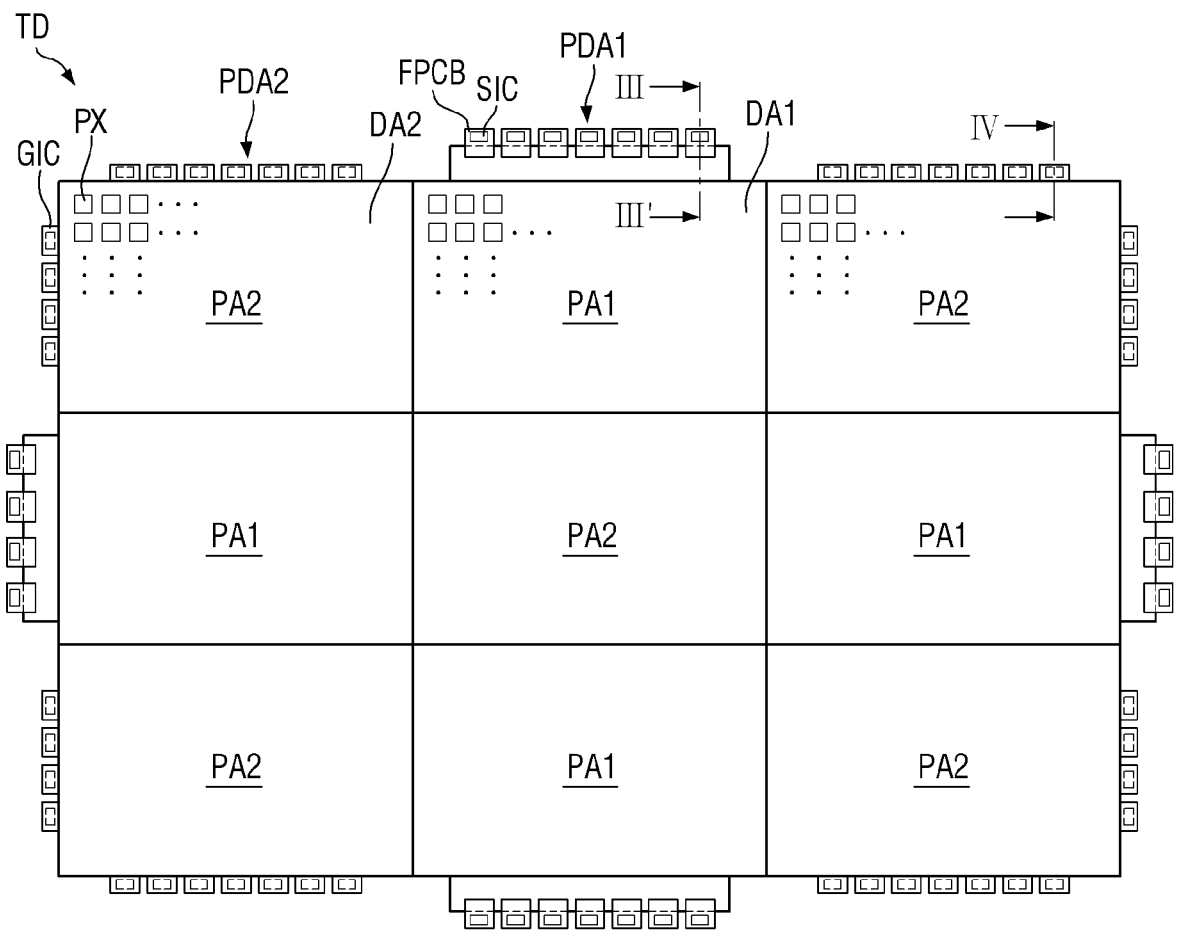
FIG. 7 is a plan view schematically showing a connecting structure of a tiled display according to an embodiment of the disclosure.

FIG. 7 is a plan view schematically showing a connecting structure of a tiled display according to an embodiment of the disclosure.

Referring to FIG. 7, a tiled display TD may include multiple display devices 10. The display devices 10 may include first display devices PA1 and second display devices PA2. Each of the first display devices PA1 and the second display devices PA2 may include a display area DA and pad areas PDA. The display area DA may include pixels PX to display images. The pad areas PDA may be extended from the display area DA to surround or overlap the display area DA and may not display images.

Specifically, each of the first display devices PA1 may include a first display area DA1 and first pad areas PDA1. The first pad areas PDA1 may be extended from the first display area DA1 to surround the first display area DA1. For example, the first pad areas PDA1 may be disposed on the four sides of the first display area DA1, respectively. Each of the second display devices PA2 may include a second display area DA2 and second pad areas PDA2. The second pad areas PDA2 may be disposed to overlap the second display area DA2 in a third direction (z-axis direction) and may be disposed under the second display area DA2. The second pad areas PDA2 may surround the second display area DA2. For example, the second pad areas PDA2 may be disposed on the four sides of the second display area DA2, respectively.

The tiled display TD may be formed by connecting the adjacent display devices 10 with one another. The display devices 10 may be connected with one another through connecting members or adhesive members. The pad areas PDA of each of the adjacent display devices 10 may overlap one another in the thickness direction (or the z-axis direction) in the respective display areas DA. Accordingly, the display areas DA of the display devices 10 may be so close to each other that the space therebetween may not be recognized by a viewer. Accordingly, the tiled display TD can allow a viewer to get immersed into the images by eliminating seams between the display devices 10 by way of preventing the space between the display devices 10 from being perceived.

The tiled display TD may include four first display devices PA1 and five second display devices PA2. The number and connecting relationship of the display devices 10 are not limited to those of the embodiment of FIG. 7. The number of display devices 10 may be determined depending on the sizes of the display devices 10 and the tiled display TD.

Flexible films FPCB may be disposed on the pad areas PDA of each of the display devices 10. The flexible films FPCB may be attached to pads disposed on a base member of each of the display devices 10. A side of the flexible films FPCB may be connected to the pad areas PDA, while another side of the flexible films FPCB may be connected to a source circuit board (not shown). The flexible films FPCB may transmit signals from source drivers SIC to the display device 10.

The source drivers SIC may be disposed on the flexible films FPCB, respectively, and may be connected to pixels of the display device 10. For example, each of the source drivers SIC may be an integrated circuit (IC). The source drivers SIC may convert digital video data into analog data voltage based on a source control signal from a timing controller, and may supply it to data lines of the display area DA through the flexible films FPCB.

The flexible films FPCB may be disposed on the pad areas PDA disposed along the edges of the tiled display TD. For example, the flexible films FPCB may be disposed on the first pad areas PDA1 of each of the first display devices PA1, and the second pad areas PDA2 of each of the second display devices PA2. It is, however, to be understood that the disclosure is not limited thereto.

Figure 8:
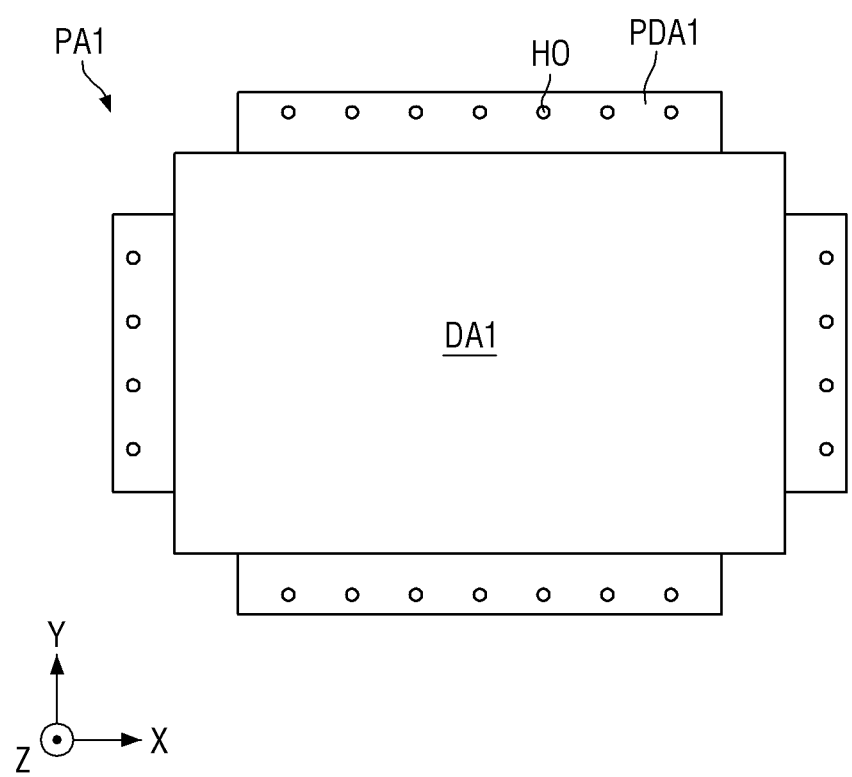
FIG. 8 is a plan view schematically showing a first display device according to an embodiment of the disclosure.
Figure 9:
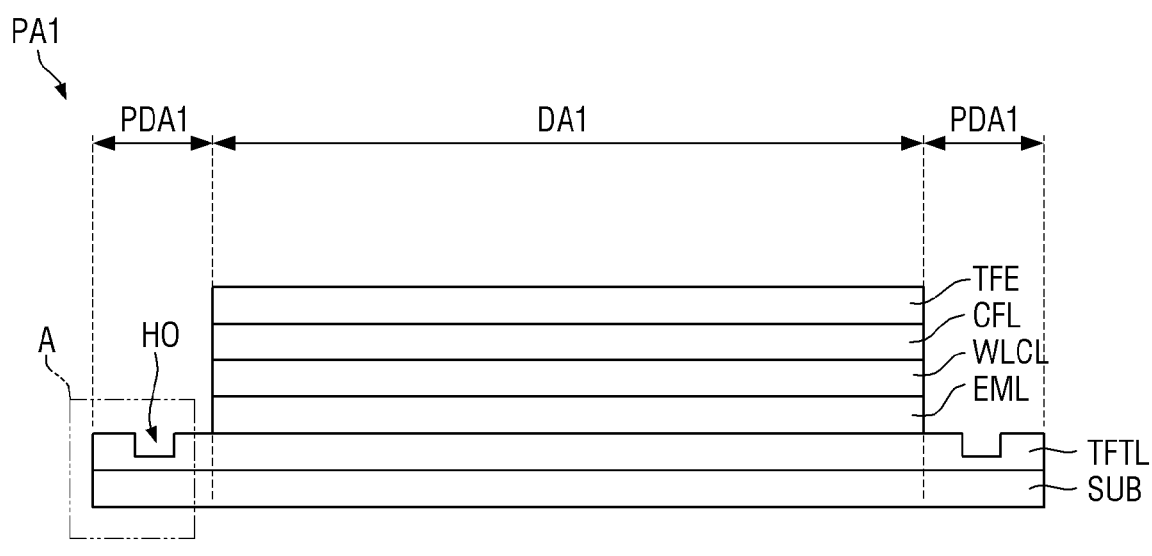
FIG. 9 is a cross-sectional view schematically showing a first display device according to an embodiment of the disclosure.
Figure 10:
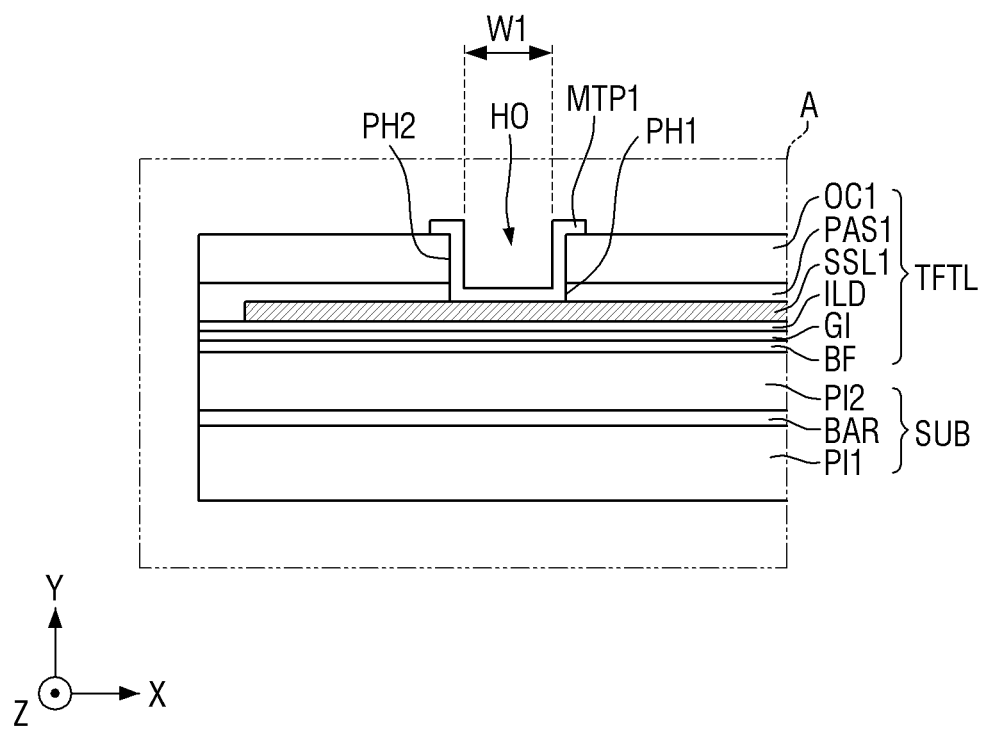
FIG. 10 is an enlarged view schematically showing area A of FIG. 9.

FIG. 8 is a plan view schematically showing a first display device according to an embodiment of the disclosure. FIG. 9 is a cross-sectional view schematically showing a first display device according to an embodiment of the disclosure. FIG. 10 is an enlarged view schematically showing area A of FIG. 9.

Referring to FIG. 8, a first display device PA1 according to an embodiment of the disclosure may include a first display area DA1 and first pad areas PDA1 surrounding the first display area DA1. The first pad areas PDA1 may be extended from the longer sides of the first display area DA1 extended in the first direction (x-axis direction) and the shorter sides of the first display area DA1 extended in the second direction (y-axis direction).

Each of the first pad areas PDA1 may include grooves HO. Signal lines extended from the first display areas DA1 may be exposed through the grooves HO, they may work as means of connecting between adjacent second display devices PA2 and/or flexible films FPCB.

The grooves HO may be spaced apart from one another at a gap in each of the first pad areas PDA1. Every groove HO may correspond to at least one first signal line. For example, signal lines may be extended from the first display areas DA1 to the first pad areas PDA1 and may be combined into a first signal line in the first pad areas PDA1 so that the first signal line may be exposed through one groove HO. It is, however, to be understood that the disclosure is not limited thereto. One first signal line may correspond to one groove HO. The gap and number of the grooves HO may be variously adjusted depending on the size of the first display device PA1.

Referring to FIG. 9, the first display device PA1 may include a substrate SUB, a thin-film transistor layer TFTL, an emission element layer EML, a wavelength conversion layer WLCL, a color filter layer CFL, and an encapsulation layer TFE.

In the first display area DA1, the substrate SUB, the thin-film transistor layer TFTL, the emission element layer EML, the wavelength conversion layer WLCL, the color filter layer CFL and the encapsulation layer TFE may overlap each other. In the first pad areas PDA1, the substrate SUB and the thin-film transistor layer TFTL may overlap each other, while the emission element layer EML, the wavelength conversion layer WLCL, the color filter layer CFL and the encapsulation layer TFE may not overlap each other.

Each of the first pad areas PDA1 may include grooves HO. The grooves HO may be formed in at least some layers of the thin-film transistor layer TFTL.

Referring to FIG. 10, in the first pad area PDA1 of the first display device PA1, the substrate SUB and the thin-film transistor layer TFTL may be disposed.

Specifically, the substrate SUB may include a first base substrate PI1, a barrier layer BAR and a second base substrate PI2. The thin-film transistor layer TFTL may be disposed on the substrate SUB. In the thin-film transistor layer TFTL, a gate insulator GI may be disposed on the buffer layer BF, and an interlayer dielectric layer ILD may be disposed on the gate insulator GI. A first signal line SSL1 may be disposed on the interlayer dielectric layer ILD. The first signal line SSL1 may be connected to a data line of the first display area DA1. A first passivation layer PAS1 may be disposed on the first signal line SSL1, and a first planarization layer OC1 may be disposed on the first passivation layer PAS1.

According to an embodiment of the disclosure, a groove HO may penetrate through the first passivation layer PAS1 and the first planarization layer OC1 to expose the first signal line SSL1. The groove HO may include a first through hole PH1 penetrating through the first passivation layer PAS1 and a second through hole PH2 penetrating through the first planarization layer OC1. The groove HO may have, but is not limited to, a circular shape, an oval shape, a polygonal shape, etc., when viewed from the top. The diameter W1 of the groove HO may be in the range of about 3 μm to about 500 μm, and may be variously adjusted depending on the size of the tile display TD. The groove HO may be formed by a laser drilling technique. A green laser, an infrared laser, an ultraviolet laser, etc. may be used for the laser drilling technique. It is, however, to be understood that the disclosure is not limited thereto. The groove HO may be formed by a photolithography process.

The groove HO may include a first connection pattern MTP1 to facilitate connection with the second display device PA2. The first connection pattern MTP1 may be disposed on the first planarization layer OC1 and may be in contact with the inside of the groove HO. Specifically, the first connection pattern MTP1 may be in contact with the upper surface of the first planarization layer OC1, the side surfaces of the first planarization layer OC1, the side surfaces of the first passivation layer PAS1, and the upper surface of the first signal line SSL1.

The first connection pattern MTP1 may be exposed to the outside and thus may be vulnerable to corrosion or oxidation. Accordingly, the first connection pattern MTP1 may be formed of a metal oxide to prevent corrosion or oxidation. For example, the first connection pattern MTP1 may be formed of, but is not limited to, indium tin oxide (ITO), indium zinc oxide (IZO), indium tin zinc oxide (ITZO), etc., or a combination thereof.

Figure 11:
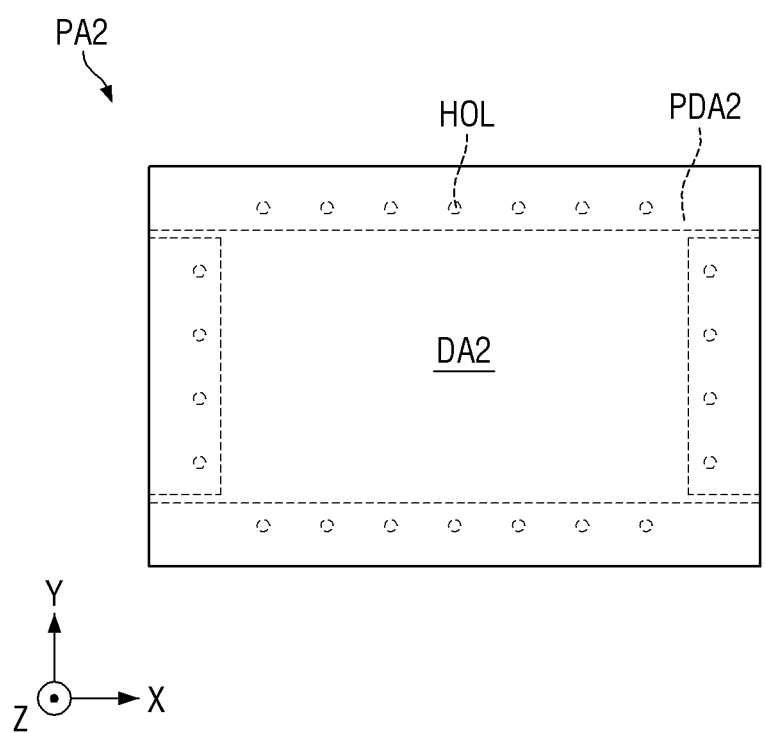
FIG. 11 is a plan view schematically showing a second display device according to an embodiment of the disclosure.
Figure 12:
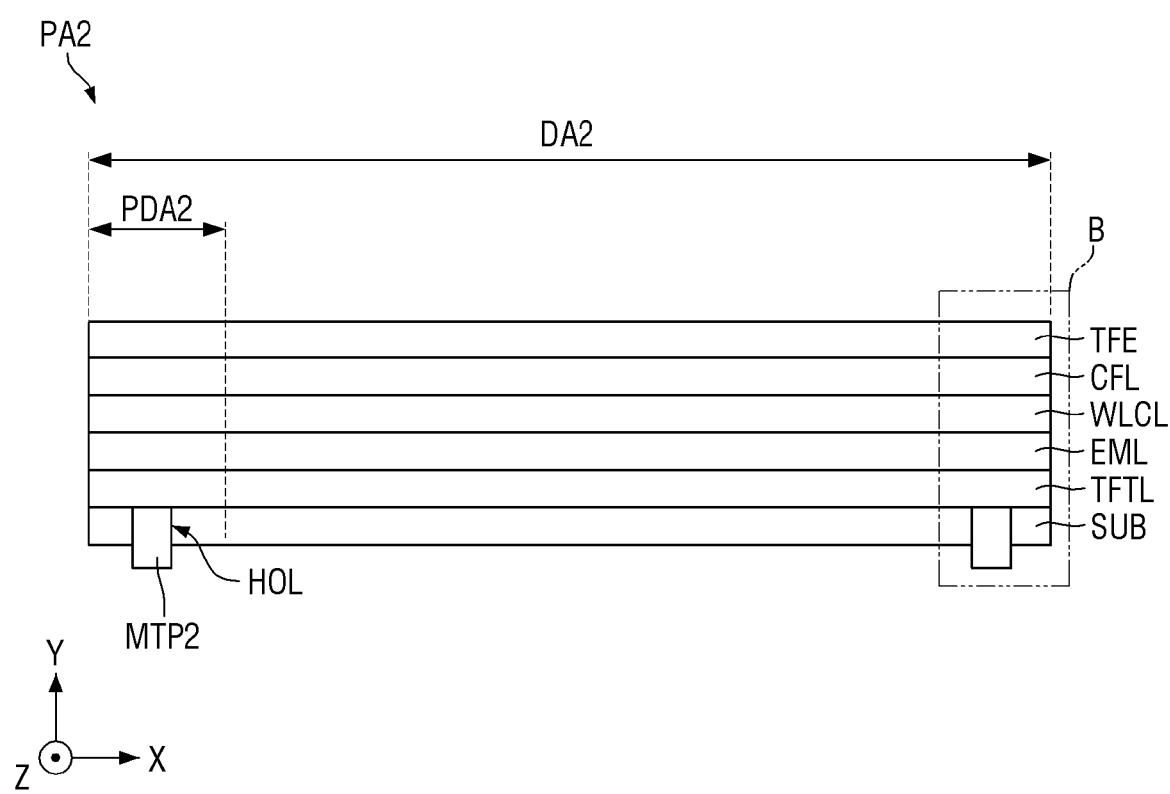
FIG. 12 is a cross-sectional view schematically showing a second display device according to an embodiment of the disclosure.
Figure 13:
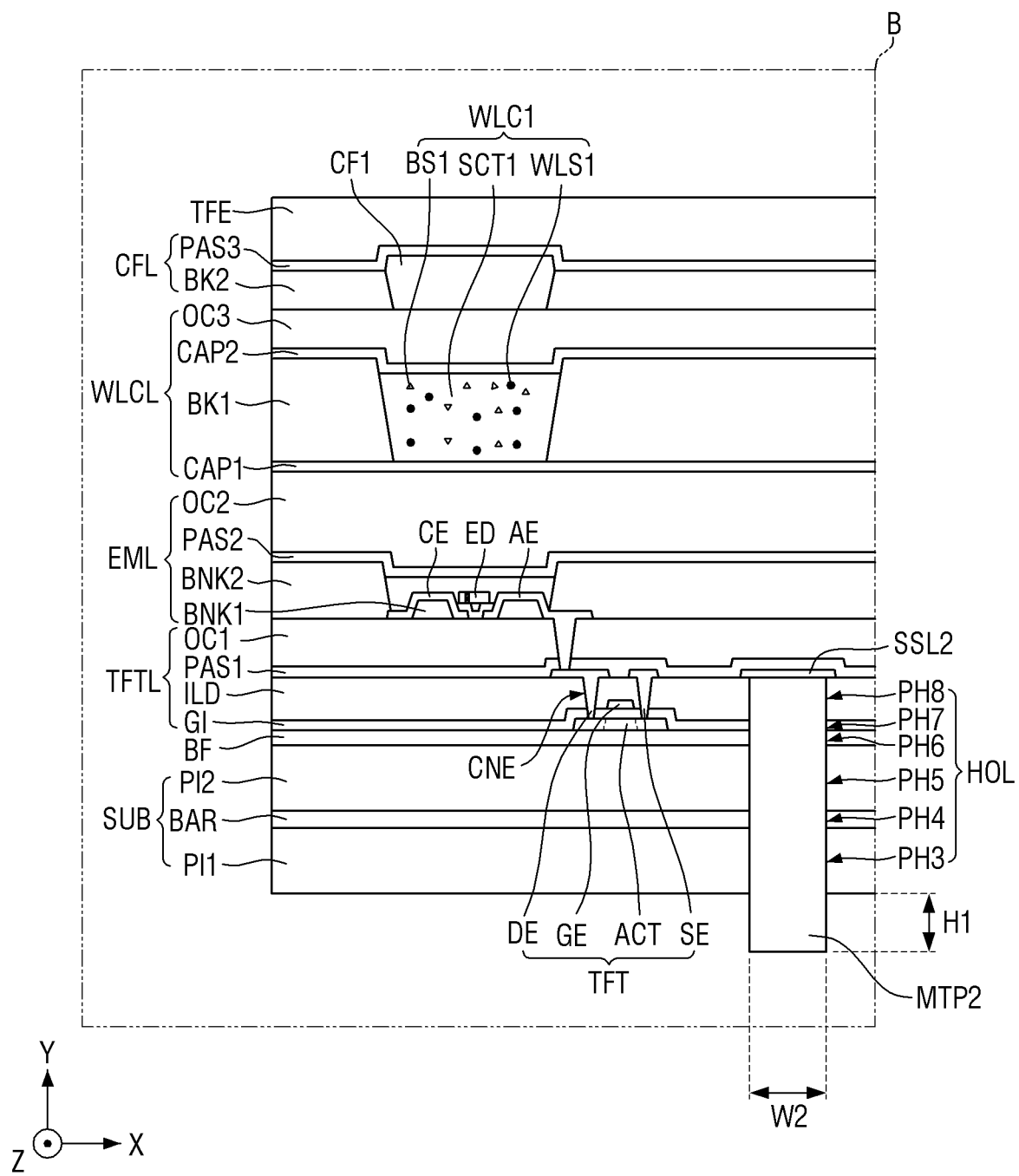
FIG. 13 is an enlarged view schematically showing area B of FIG. 12.

FIG. 11 is a plan view schematically showing a second display device according to an embodiment of the disclosure. FIG. 12 is a cross-sectional view schematically showing a second display device according to an embodiment of the disclosure. FIG. 13 is an enlarged view schematically showing area B of FIG. 12.

Referring to FIG. 11, a second display device PA2 according to an embodiment of the disclosure may include a second display area DA2 and second pad areas PDA2 surrounding the second display area DA2. The second pad areas PDA2 may be disposed so that they overlap the longer sides of the second display area DA2 extended in the first direction (x-axis direction) and the shorter sides of the second display area DA2 extended in the second direction (y-axis direction), respectively.

Each of the second pad areas PDA2 may include holes HOL. Second signal lines extended from the second display areas DA2 may be exposed through the holes HO, they may work as means of connecting between adjacent first display areas PA1 and/or flexible films FPCB.

The holes HOL may be spaced apart from one another at a gap in each of the second pad areas PDA2. Every hole HOL may correspond to at least one second signal line. For example, second signal lines may be extended from the second display areas DA2 to the second pad areas PDA2 and may be combined into a second signal line in the second pad areas PDA2 so that it may be exposed through one hole HOL. It is, however, to be understood that the disclosure is not limited thereto. One second signal line may correspond to one hole HOL. The gap and number of the holes HOL may be variously adjusted depending on the size of the second display device PA2.

Referring to FIG. 12, the second display device PA2 may include a substrate SUB, a thin-film transistor layer TFTL, an emission element layer EML, a wavelength conversion layer WLCL, a color filter layer CFL, and an encapsulation layer TFE.

In the second display area DA2, the substrate SUB, the thin-film transistor layer TFTL, the emission element layer EML, the wavelength conversion layer WLCL, the color filter layer CFL and the encapsulation layer TFE may overlap each other. The second pad areas PDA2 may overlap the second display area DA2 and may be the edges of the second display area DA2. For example, in the second pad area PDA2, the substrate SUB, the thin-film transistor layer TFTL, the emission element layer EML, the wavelength conversion layer WLCL, the color filter layer CFL and the encapsulation layer TFE may overlap each other.

The second pad areas PDA2 may include multiple holes HOL. The holes HOL may be formed in the substrate SUB and at least some layers of the thin-film transistor layer TFTL.

Referring to FIG. 13, in the second pad area PDA2 of the second display device PA2, the substrate SUB, the thin-film transistor layer TFTL, the emission element layer EML, the wavelength conversion layer WLCL, the color filter layer CFL, and the encapsulation layer TFE may be disposed.

Specifically, the substrate SUB may include a first base substrate PI1, a barrier layer BAR and a second base substrate PI2. The thin-film transistor layer TFTL may be disposed on the substrate SUB. In the thin-film transistor layer TFTL, a gate insulator GI may be disposed on the buffer layer BF, and an interlayer dielectric layer ILD may be disposed on the gate insulator GI. A second signal line SSL2 may be disposed on the interlayer dielectric layer ILD. The second signal line SSL2 may be connected to a data line of the second display area DA2. A first passivation layer PAS1 may be disposed on the second signal line SSL2, and a first planarization layer OC1 may be disposed on the first passivation layer PAS1. An emission element layer EML, a wavelength conversion layer WLCL, a color filter layer CFL, and an encapsulation layer TFE may be disposed on the first planarization layer OC1.

According to an embodiment of the disclosure, the hole HOL may be formed in at least a portion of the substrate SUB and the thin-film transistor layer TFTL. Specifically, the hole HOL may penetrate through the first base substrate PI1, the barrier layer BAR, the second base substrate PI2, the buffer layer BF, the gate insulator GI and the interlayer dielectric layer to expose the second signal line SSL2. The hole HOL may include a third through hole PH3 penetrating through the first base substrate PI1, a fourth through hole PH4 penetrating through the barrier layer BAR, a fifth through hole PH5 penetrating through the second base substrate PI2, a sixth through hole PH6 penetrating through the buffer layer BF, a seventh through hole PH7 penetrating through the gate insulator GI, and an eighth through hole PH8 penetrating through the interlayer dielectric layer ILD. The hole HOL may be formed by a laser drilling technique in the same manner as the aforementioned groove HO, but the disclosure is not limited thereto. It may be formed via a photolithography process.

The hole HOL may have, but is not limited to, a circular shape, an oval shape, a polygonal shape, etc., when viewed from the top. The shape of the hole HOL may conform to the shape of the above-described groove HO when viewed from the top. The diameter W2 of the hole HOL may be in the range of about 3 μm to about 500 μm, and may be smaller than the diameter W1 of the groove HO.

The hole HOL may include a second connection pattern MTP2 to facilitate connection with the first display device PM. The hole HOL may be filled with the second connection pattern MTP2, which may be a protrusion connected to the second signal line SSL2 and protruding to the outside of the first base substrate PI1. Specifically, the second connection pattern MTP2 may be in contact with the side surfaces of the first base substrate PI1, the side surfaces of the barrier layer BAR, the side surfaces of the second base substrate PI2, the side surfaces of the buffer layer BF, the side surfaces of the gate insulator GI, the side surfaces of the interlayer dielectric layer ILD, and the lower surface of the second signal line SSL2.

The diameter of the second connection pattern MTP2 may be equal to the diameter W2 of the hole HOL. The second connection pattern MPT2 may protrude to the outside of the first base substrate PI1 to be inserted into the groove HO of the first display device PM. The diameter of the second connection pattern MTP2 may be smaller than the diameter of the groove HO, so that it can be easily inserted into the groove HO. The height H1 of the second connection pattern MTP2 protruding to the outside of the first base substrate PI1 may be larger than the depth of the groove HO of the first display device PM. Accordingly, the second connection pattern MPT2 can be easily inserted into the groove HO.

The second connection pattern MTP2 may be formed of a conductive material so that the hole HOL may be filled with the second connection pattern MTP2 and it can be connected to the first connection pattern MTP1 of the groove HO. For example, the conductive material may be a metal, and may be a metal layer in which a metal may be stacked, a metal pin having a pin shape, or a silver (Ag) dot. It is, however, to be understood that the disclosure is not limited thereto.

Hereinafter, a connecting structure of the first display device PA1 and the second display device PA2 according to the above-described embodiment will be described.

Figure 14:
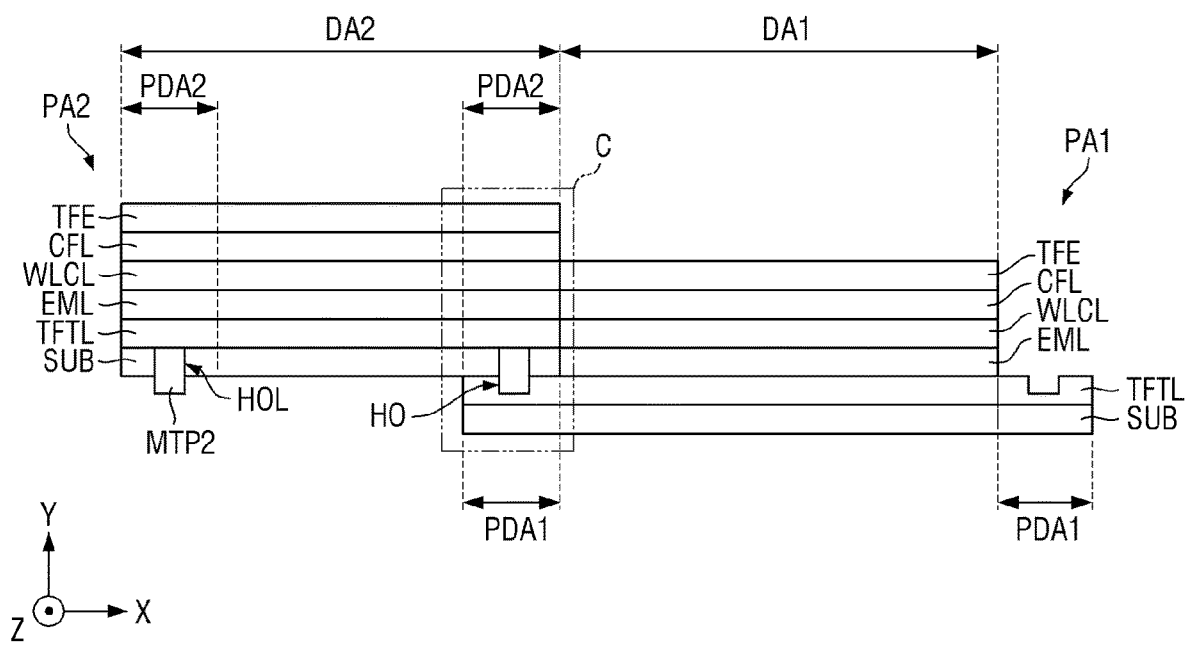
FIG. 14 is a cross-sectional view schematically showing the first display device and the second display device connected to each other according to an embodiment of the disclosure.
Figure 15:
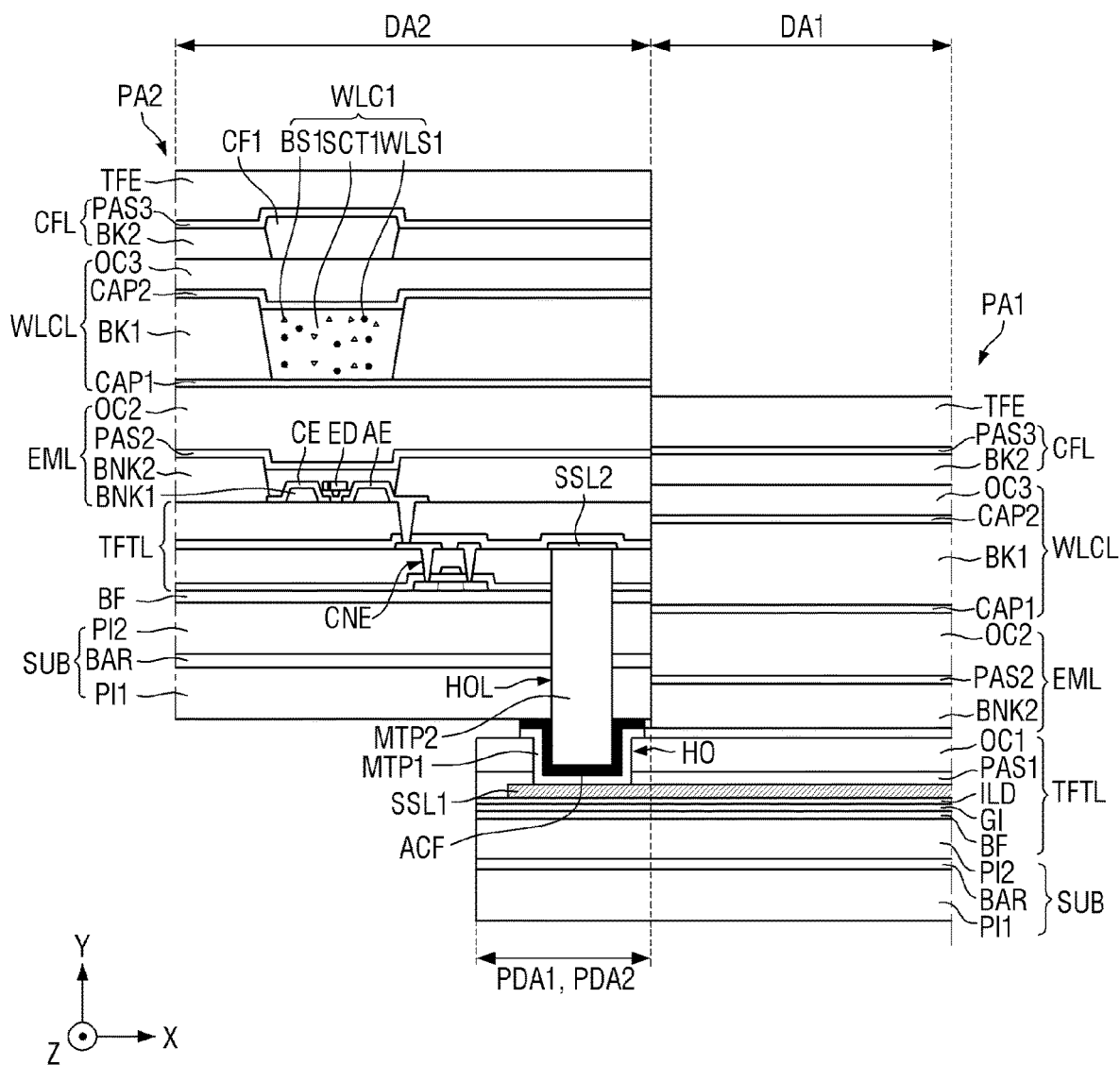
FIG. 15 is an enlarged view schematically showing area C of FIG. 14.

FIG. 14 is a cross-sectional view schematically showing the first display device and the second display device connected to each other according to an embodiment of the disclosure. FIG. 15 is an enlarged view schematically showing area C of FIG. 14.

Referring to FIG. 14, a first display device PA1 and a second display device PA2 may be connected to each other to be electrically connected with each other. A first pad area PDA1 of the first display device PA1 may overlap a second pad area PDA2 of the second display device PA2. Although the first display area DA1 of the first display device PA1 and the second display area DA2 of the second display device PA2 may be in contact with each other, but the disclosure is not limited thereto. They may be spaced apart from each other by a minimum distance. The upper surface of the first pad area PDA1 of the first display device PA1 may be in contact with the lower surface of the second pad area PDA2 of the second display device PA2. A second connection pattern MTP2 disposed in the second pad area PDA2 of the second display device PA2 may be inserted into the groove HO formed in the first pad area PDA1 of the first display device PA1 so that they may be connected to each other.

Specifically, referring to FIG. 15, in the first display device PA1, a first signal line SSL1 may be disposed on the interlayer dielectric layer ILD. A first passivation layer PAS1 may be disposed on the first signal line SSL1, and a first planarization layer OC1 may be disposed on the first passivation layer PAS1. A groove HO may penetrate through the first passivation layer PAS1 and the first planarization layer OC1 to expose the first signal line SSL1. The first connection pattern MTP1 may be disposed on the first planarization layer OC1 and may be in contact with the inside of the groove HO.

In the second display device PA2, the second signal line SSL2 may be disposed on the interlayer dielectric layer ILD, the first passivation layer PAS1 may be disposed on the second signal line SSL2, and the first planarization layer OC1 may be disposed on the first passivation layer PAS1. The hole HOL may penetrate through the first base substrate PI1, the barrier layer BAR, the second base substrate PI2, the buffer layer BF, the gate insulator GI and the interlayer dielectric layer to expose the second signal line SSL2. The hole HOL may be filled with the second connection pattern MTP2, which may be connected to the second signal line SSL2 and protrude to the outside of the first base substrate PI1.

The second connection pattern MTP2 of the second display device PA2 may be inserted into the groove HO of the first display device PM. Specifically, the second connection pattern MTP2 may be disposed adjacent to the first connection pattern MTP1 disposed in the groove HO of the first display device PA1. An anisotropy conductive film (ACF) may be disposed between the first connection pattern MTP1 of the first pad area PDA1 of the first display device PA1 and the second connection pattern MTP2 of the second pad area PDA2 of the second display device PA2. In the anisotropic conductive film (ACF), conductive balls may be mixed in an adhesive resin. Accordingly, electricity can be transmitted through the conductive balls, and the connection patterns can be attached.

The anisotropic conductive film ACF may electrically connect the first connection pattern MTP1 with the second connection pattern MTP2. The anisotropic conductive film ACF may be in contact with each of the first connection pattern MTP1 and the second connection pattern MTP2, and may also be in contact with the surface of the first planarization layer OC1 of the first display device PA1 and the surface of the first base substrate PI1 of the second display device PA2. The first connection pattern MTP1 of the first display device PA1 may be connected to the second connection pattern MTP2 of the second display device PA2 through anisotropic conductive film ACF via a thermal compression process.

Accordingly, the data line of the first display device PA1 may be connected to the data line of the second display device PA2 as the first connection pattern MTP1 may be connected to the second connection pattern MTP2. Likewise, the first connection pattern MTP1 connected to a gate line may be formed in another first pad area PDA1 of the first display device PA1, so that gate lines may be connected to each other through the second connection pattern MTP2 connected to a gate line in the second pad area PDA2 of the second display device PA2.

The first display device PA1 and the second display device PA2 thus connected may be connected to the flexible films FPCB through other first pad area PDA1 and second pad area PDA2.

Figure 16:
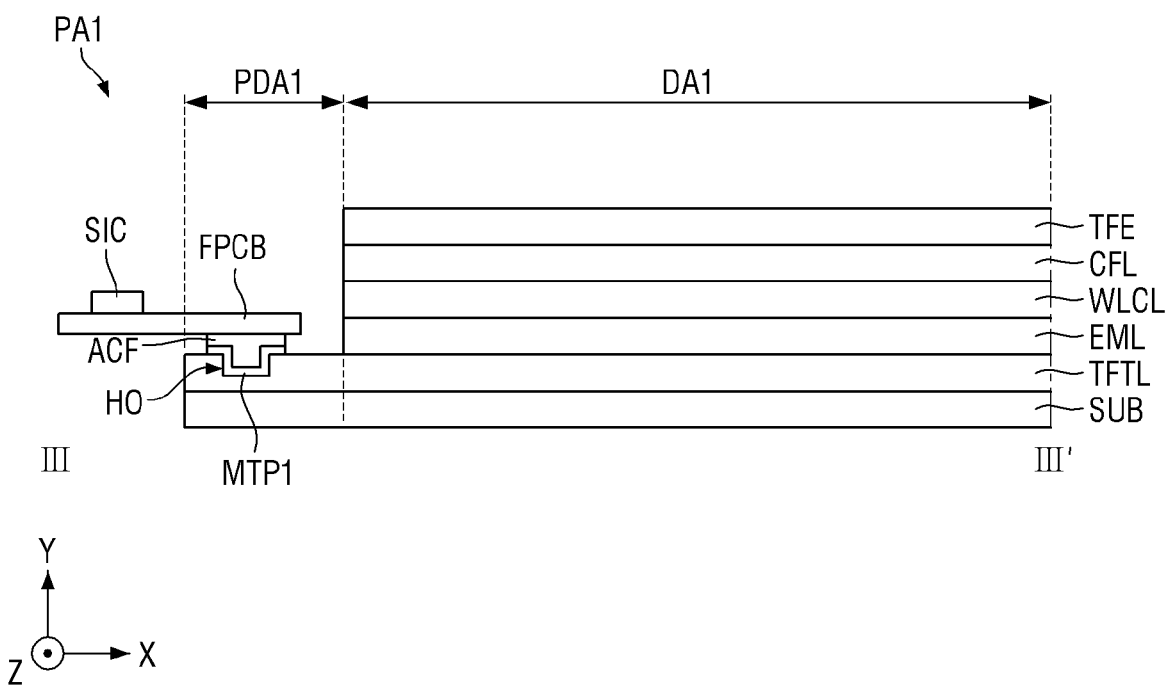
FIG. 16 is a cross-sectional view schematically showing the first display device, taken along line III-III' of FIG. 7.
Figure 17:
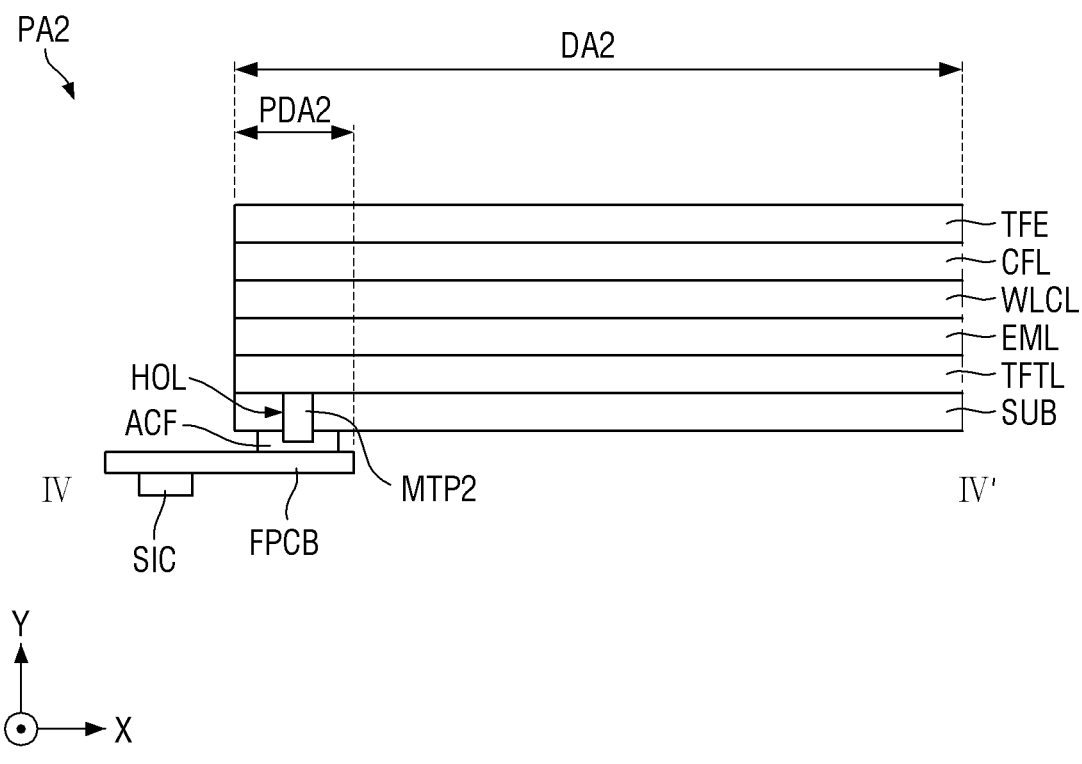
FIG. 17 is a cross-sectional view schematically showing the second display device, taken along line IV-IV' of FIG. 7.

FIG. 16 is a cross-sectional view schematically showing the first display device, taken along line III-III' of FIG. 7. FIG. 17 is a cross-sectional view schematically showing the second display device, taken along line IV-IV' of FIG. 7. In the following description, the same elements as those described above will be briefly described or omitted.

Referring to FIG. 16, the first display device PA1 may include the first pad area PDA1 extended from the first display area DA1. The flexible film FPCB may be connected to the first pad area PDA1. Specifically, the first pad area PDA1 may include the groove HO formed in the thin-film transistor layer TFTL, and the first connection pattern MTP1 may be disposed in the groove HO. The flexible film FPCB may be connected to the first connection pattern MTP1 through the anisotropic conductive film ACF to transmit external data or a gate signal to the first display area DA1.

Referring to FIG. 17, the second display device PA2 may include a pad area PDA2 at the edge overlapping the second display area DA2. The flexible film FPCB may be connected to the second pad area PDA2. Specifically, the second pad area PDA2 may include the hole HOL formed in the substrate SUB and the thin-film transistor layer TFTL, and the second connection pattern MTP2 may be disposed in the hole HOL. The flexible film FPCB may be connected to the second connection pattern MTP2 through the anisotropic conductive film ACF to transmit external data or a gate signal to the second display area DA2.

As described above, according to an embodiment of the disclosure, the first display devices PA1 may have the grooves HO and the second display devices PA2 may have the protrusions, and thus the tiled display TD can be formed by connecting the grooves HO with the protrusions. Accordingly, the tiled display TD can allow a viewer to get immersed into the images by suppressing the boundary between the display areas DA of the display devices 10 from being perceived by the viewer.

Figure 18:
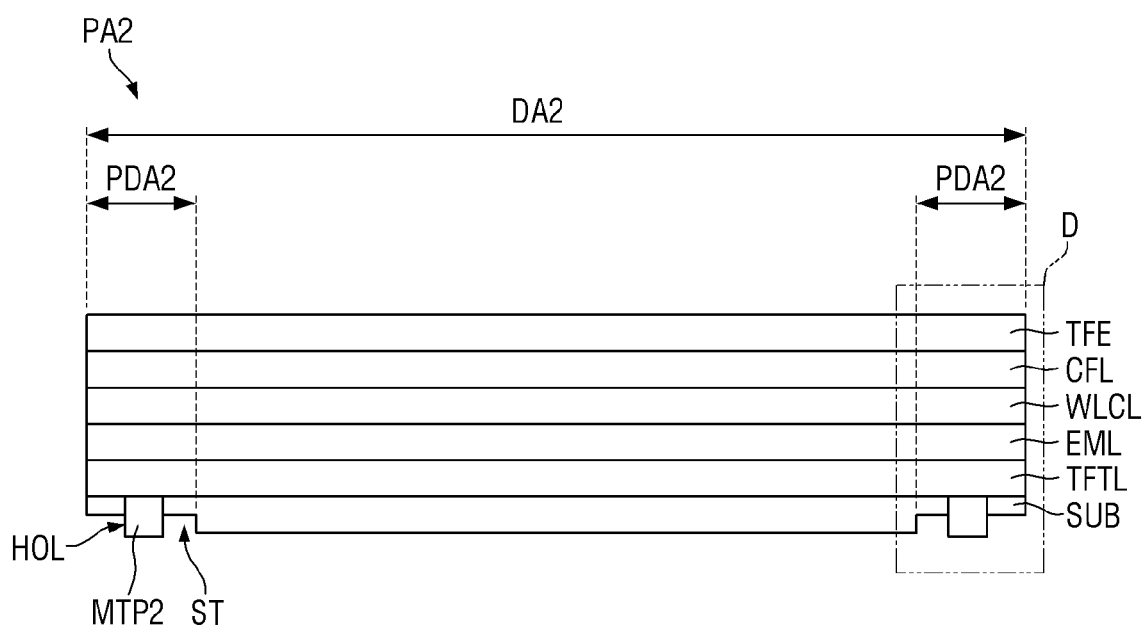
FIG. 18 is a cross-sectional view schematically showing a second display device according to another embodiment.
Figure 19:
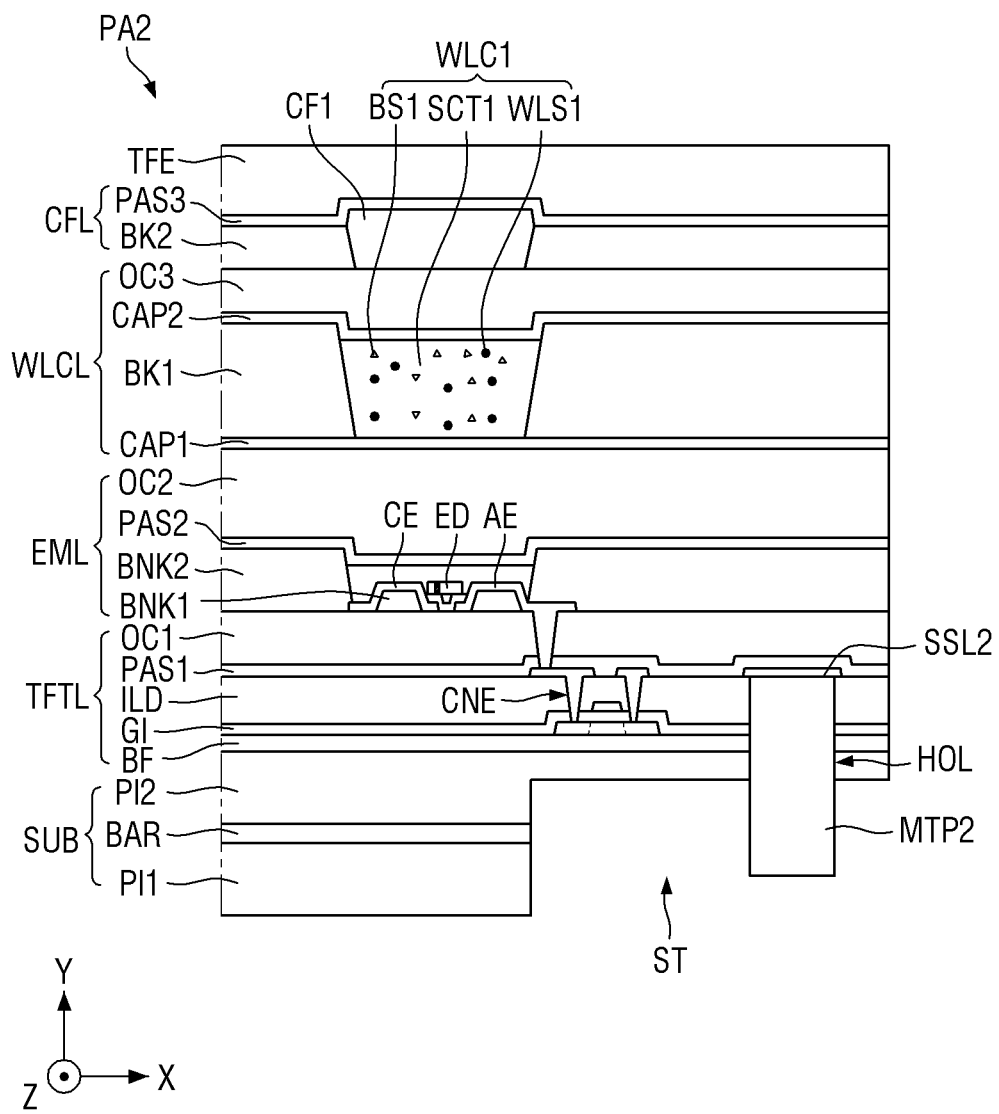
FIG. 19 is an enlarged view schematically showing area D of FIG. 18.
Figure 20:
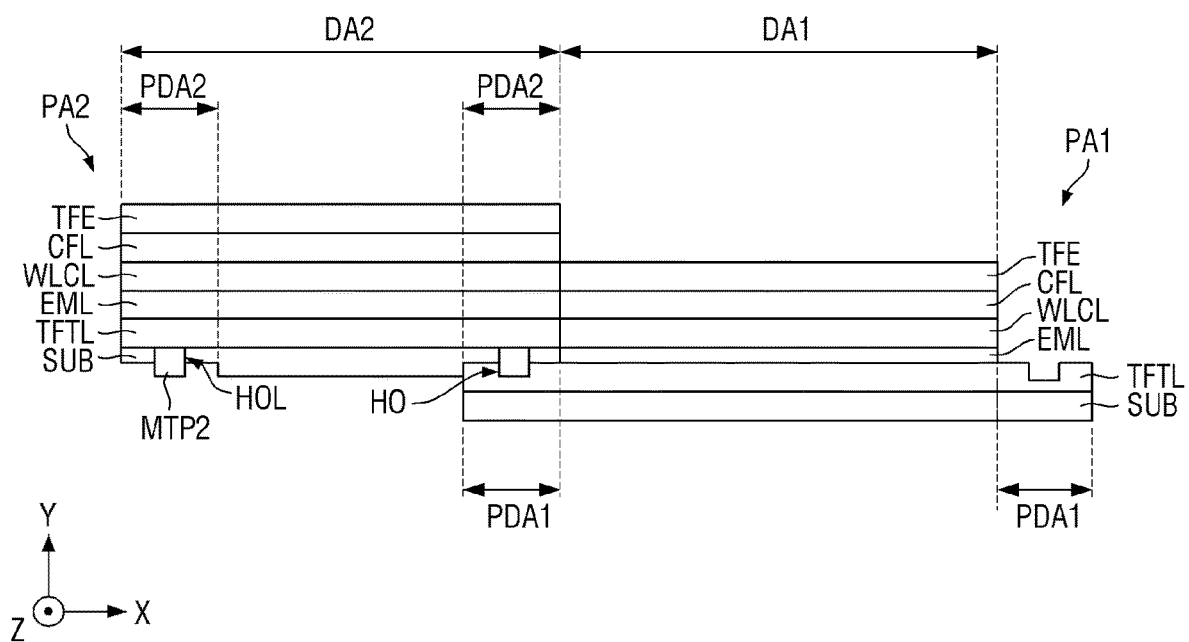
FIG. 20 is a cross-sectional view schematically showing a first display device and a second display device connected to each other according to another embodiment.

FIG. 18 is a cross-sectional view schematically showing a second display device according to another embodiment. FIG. 19 is an enlarged view schematically showing area D of FIG. 18. FIG. 20 is a cross-sectional view schematically showing a first display device and a second display device connected to each other according to another embodiment.

The second display device PA2 according to the embodiment of FIGS. 18 and 19 may include multiple holes HOL formed in the second pad areas PDA2. The embodiment of FIGS. 18 and 19 may be different from the embodiment of FIGS. 11 to 17 described above in that the substrate SUB of the second pad area PDA2 may have a step ST. In the following description, the description will focus on the difference and redundant description will be omitted.

Referring to FIG. 18, the second display device PA2 may include a substrate SUB, a thin-film transistor layer TFTL, an emission element layer EML, a wavelength conversion layer WLCL, a color filter layer CFL, and an encapsulation layer TFE.

The second pad areas PDA2 may include holes HOL. The holes HOL may be formed in the substrate SUB and at least some layers of the thin-film transistor layer TFTL. Each of the second pad areas PDA2 may include a step ST. The step ST may be a portion of the substrate SUB that may be thinner than another portion in each of the second pad areas PDA2. The step ST may be formed in at least a portion of the second pad area PDA2 or may be formed in the entire second pad area PDA2. Multiple holes HOL may be formed in the step ST, and a second connection pattern MTP2 may be disposed.

Referring to FIG. 19, in the second pad area PDA2 of the second display device PA2, the substrate SUB, the thin-film transistor layer TFTL, the emission element layer EML, the wavelength conversion layer WLCL, the color filter layer CFL, and the encapsulation layer TFE may be disposed.

The step ST may be formed in the second pad area PDA2. The step ST may be formed by removing at least a portion of the first base substrate PI1, the barrier layer BAR and the second base substrate PI2. The step ST can reduce a level difference between the first display area PA1 and the second display device PA2 in the second direction DR2 that may be formed in case that the first display device PA1 and the second display device PA2 may be connected to each other.

Although the step ST may be formed by partially removing the first base substrate PI1, the barrier layer BAR and the second base substrate PI2 according to an embodiment, the disclosure is not limited thereto. The step ST may be formed by removing at least a portion of the first base substrate PI1 or the first base substrate PI1 and the barrier layer BAR. In other embodiments, the step ST may be formed by entirely removing the first base substrate PI1, the barrier layer BAR and the second base substrate PI2. In the step ST, the side surface of the first base substrate PI1 and the side surface of the barrier layer BAR may overlap the lower surface of the second base substrate PI2.

Referring to FIG. 20, the first display device PA1 and the second display device PA2 may be connected to each other and may be electrically connected with each other. The first pad area PDA1 of the first display device PA1 may overlap the second pad area PDA2 of the second display device PA2.

The step ST formed in the second pad area PDA2 of the second display device PA2 may be in contact with the first pad area PDA1 of the first display device PM. Specifically, the side surface of the step ST may be in contact with the side surface of the first pad area PDA1 of the first display device PA1, and the surface of the step ST located in the second direction (y-axis direction) may be in contact with the upper surface of the first pad area PDA1. A second connection pattern MTP2 disposed in the second pad area PDA2 of the second display device PA2 may be inserted into the groove HO formed in the first pad area PDA1 of the first display device PA1 so that they may be connected to each other.

In this manner, the level difference in the second direction (y-axis direction) between the upper surface of the first display device PA1 and the second display device PA2 can be reduced, thereby avoiding the seams of the tiled display TD from being perceived.

Figure 21:
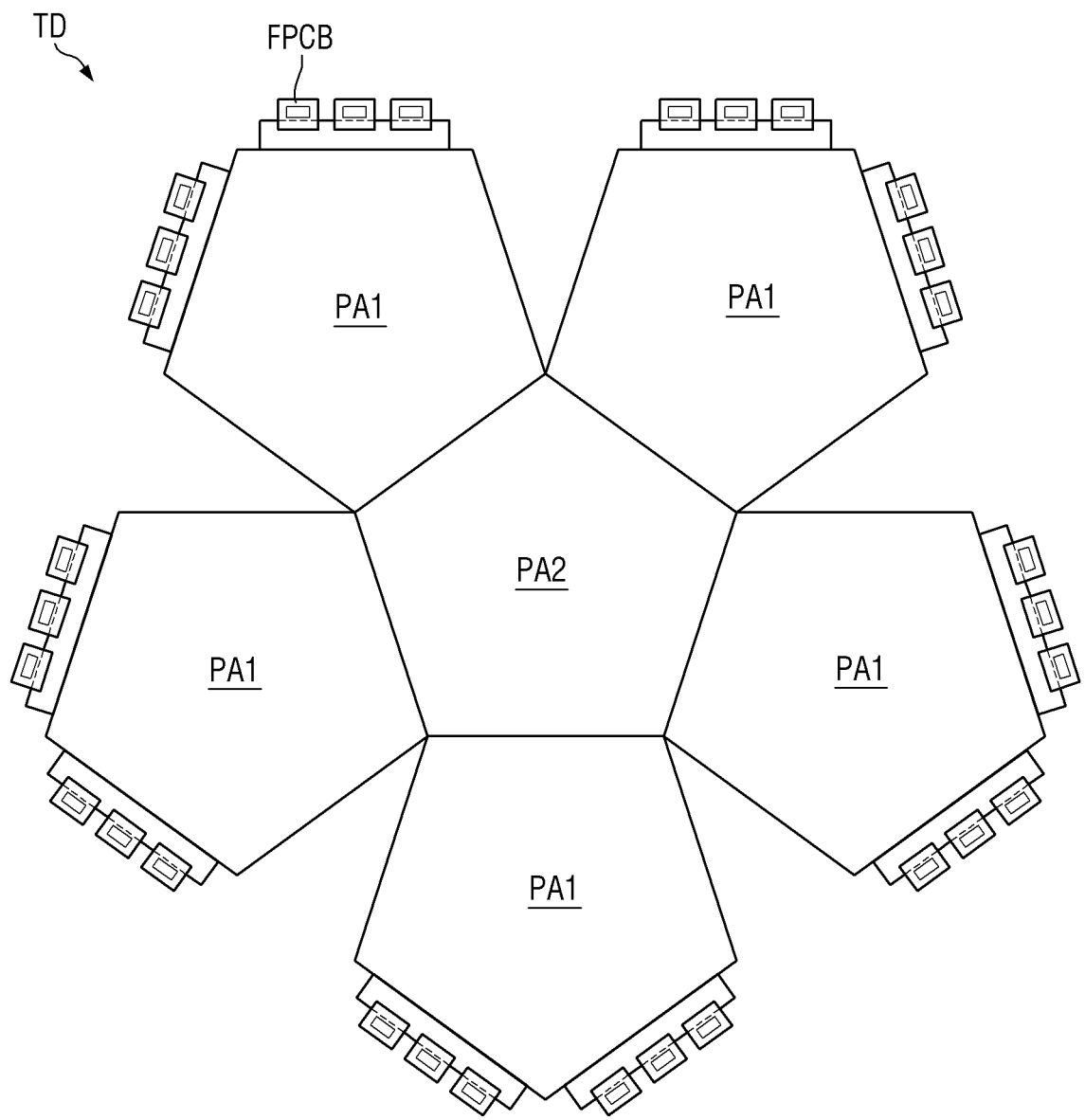
FIGS. 21 and 22 are plan views schematically showing tiled displays according to other embodiments of the disclosure.
Figure 22:
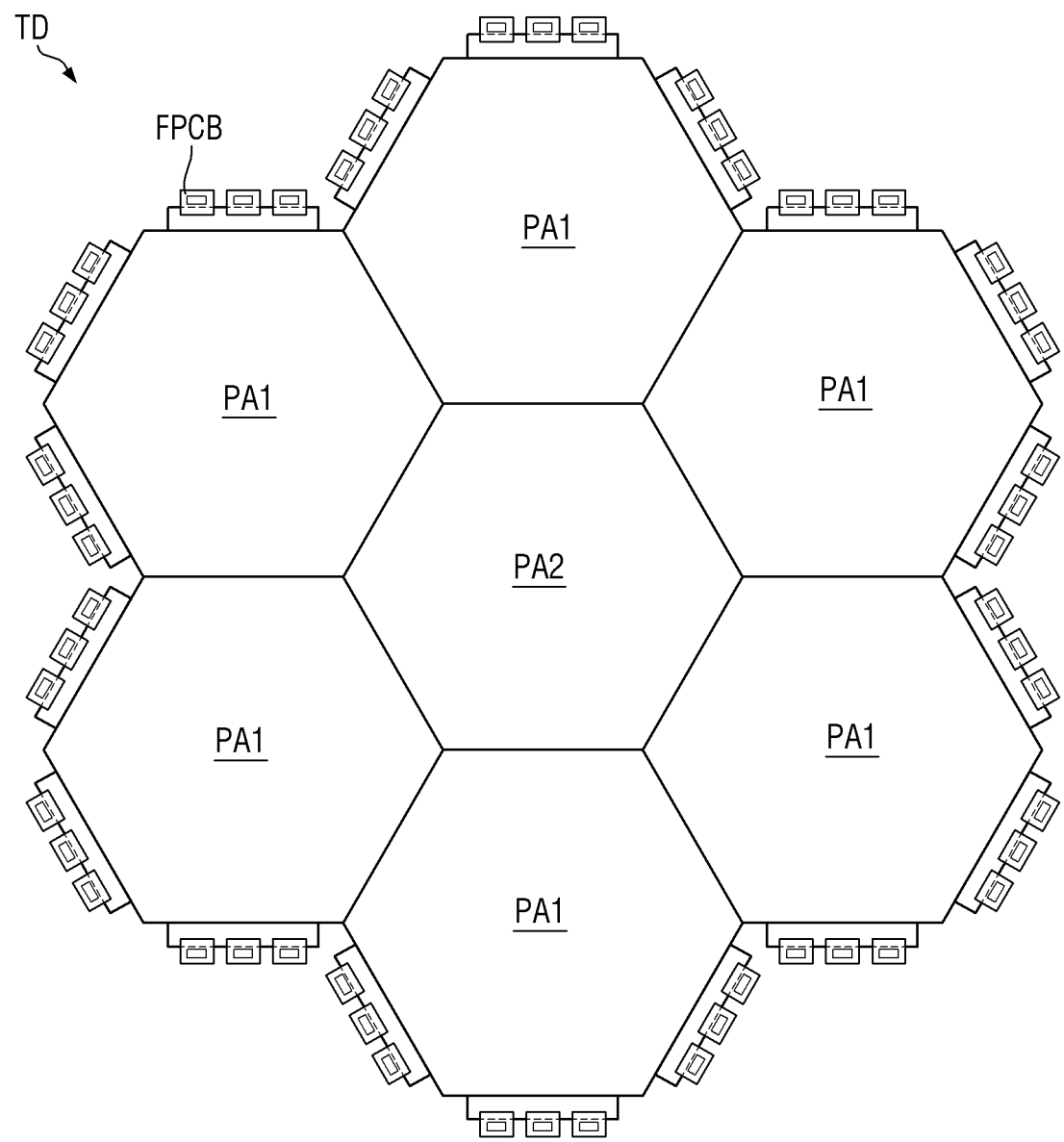

FIGS. 21 and 22 are plan views schematically showing tiled displays according to other embodiments of the disclosure.

Referring to FIG. 21, unlike the flat tiled display TD of FIG. 7, the tiled device TD according to the embodiment of FIG. 21 may be applied to a three-dimensional tiled display TD. In case that the tiled display TD has a pentagonal column shape, a second display device PA2 may be disposed at the center and first display devices PA1 may be disposed on the five sides of the second display device PA2, respectively. The sides of each of the first display devices PA1 may be in contact with the sides of adjacent first display devices PA1. Flexible films FPCB may be eliminated from the sides where the first display devices PA1 may be in contact with one another, and thus the first display devices PA1 can be in contact with one another.

According to the embodiment of FIG. 22, each of display devices 10 of a tiled display TD may have a hexagonal shape. In this example, a second display device PA2 may be disposed at the center, and the first display devices PA1 may be disposed on the sides of the second display device PA2, respectively. Like the embodiment of FIG. 21, flexible films FPCB may be eliminated from the sides where the first display devices PA1 may be in contact with one another, and thus the first display devices PA1 can be in contact with one another.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A tiled display comprising:
a first display device comprising a first display area and a first pad area having grooves; and
a second display device comprising a second display area and a second pad area overlapping the second display area, the second pad area having protrusions, wherein the protrusions are inserted into the grooves to connect the first pad area with the second pad area, the first pad area comprises z first signal line extended from the first display area, and the grooves expose the first signal line, wherein the first pad area comprises first connection patterns filling the grooves, the protrusions of the second pad area comprise second connection patterns, the second connection patterns being conductive, the second pad area comprises a second signal line extended from the second display area, and the second connection patterns contact the second signal line.

2. The tiled display of claim 1, wherein the first connection patterns contact the first signal line through the grooves.

3. The tiled display of claim 1, wherein the second pad area comprises:

holes exposing the second signal line.

4. The tiled display of claim 3, wherein the second connection patterns contact the second signal line through the holes exposing the second signal line.

5. The tiled display of claim 3, wherein a diameter of the second connection patterns is equal to a diameter of the holes, and the diameter of the second connection patterns is smaller than a diameter of the grooves.

6. The tiled display of claim 1, wherein the second display device comprises a substrate, and the second connection patterns protrude to outside of the substrate.

7. The tiled display of claim 6, wherein a height of the second connection patterns protruding from the substrate is greater than a depth of the grooves of the first pad area.

8. The tiled display of claim 1, further comprising:

anisotropic conductive films disposed between the second connection patterns and the first connection patterns.

9. The tiled display of claim 1, wherein each of the first connection patterns includes at least one of ITO, IZO, and ITZO.

10. The tiled display of claim 1, wherein the second connection patterns include at least one of a metal layer, a metal pin, and a silver (Ag) dot.

11. The tiled display of claim 1, wherein the first pad area does not overlap the first display area and overlaps the second pad area.

12. A tiled display comprising:

a first display device comprising a first display area and a first pad area having grooves; and a second display device comprising a second display area and a second pad area overlapping the second display area, the second pad area having protrusions, wherein the second display device comprises a substrate, and a step in the second pad area that includes a thinner portion of the substrate, the protrusions are inserted into the grooves to connect the first pad area with the second pad area, the first pad area comprises a first signal line extended from the first display area, and the grooves expose the first signal line, the first pad area comprises first connection patterns filling the grroves, the protrusions of the second pad area comprise second connection patterns, the second connection patterns being conductive, the second pad area comprises a second signal line, and the second connection patterns contact the second signal line.

13. The tiled display of claim 12, wherein the substrate comprises:

a first base substrate;

a barrier layer disposed on the first base substrate; and a second base substrate disposed on the barrier layer.

14. The tiled display of claim 13, wherein the step is formed by removing at least one of the first base substrate, the barrier layer, and the second base substrate in the second pad area.

15. The tiled display of claim 12, wherein the first connection patterns contact the first signal line through the grooves.

16. The tiled display of claim 15, wherein the second pad area comprises:

holes exposing the second signal line, and the second connection patterns contact the second signal line through the holes exposing the second signal line.

17. The tiled display of claim 16, further comprising:

anisotropic conductive films disposed between the first connection patterns and the second connection patterns.

* * * * *